United States Patent
Park et al.

(10) Patent No.: US 11,069,768 B2
(45) Date of Patent: Jul. 20, 2021

(54) SEMICONDUCTOR DEVICE AND METHOD OF FABRICATING THE SAME

(71) Applicant: SAMSUNG ELECTRONICS CO., LTD., Suwon-si (KR)

(72) Inventors: Young-Lim Park, Anyang-si (KR); Se Hyoung Ahn, Seoul (KR); Sang Yeol Kang, Yongin-si (KR); Chang Mu An, Osan-si (KR); Kyoo Ho Jung, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/781,151

(22) Filed: Feb. 4, 2020

(65) Prior Publication Data

US 2020/0403062 A1 Dec. 24, 2020

(30) Foreign Application Priority Data

Jun. 18, 2019 (KR) .......................... 10-2019-0071903

(51) Int. Cl.
*H01L 27/11507* (2017.01)
*H01L 27/108* (2006.01)
*H01L 49/02* (2006.01)

(52) U.S. Cl.
CPC ........ *H01L 28/60* (2013.01); *H01L 27/10805* (2013.01); *H01L 27/11507* (2013.01)

(58) Field of Classification Search
CPC .............. H01L 28/60; H01L 27/11507; H01L 27/10805; H01L 27/10852; H01L 28/90
See application file for complete search history.

(56) References Cited

U.S. PATENT DOCUMENTS

| | | | |
|---|---|---|---|
| 6,307,731 | B1 | 10/2001 | Katori |
| 8,652,926 | B1 | 2/2014 | Lugani et al. |
| 9,012,298 | B2 | 4/2015 | Malhotra et al. |
| 9,059,331 | B2 | 6/2015 | Park et al. |
| 9,318,546 | B1 | 4/2016 | Phatak |
| 2009/0065896 | A1 | 3/2009 | Hwang |
| 2012/0040507 | A1* | 2/2012 | Lee .................. H01L 27/10817 438/381 |
| 2012/0270727 | A1 | 10/2012 | Yabuchi |

* cited by examiner

*Primary Examiner* — David Vu
(74) *Attorney, Agent, or Firm* — Lee IP Law, P.C.

(57) ABSTRACT

A semiconductor device includes a landing pad on a substrate, a lower electrode on the landing pad and connected to the landing pad, the lower electrode including an outer portion, the outer portion including first and second regions, and an inner portion inside the outer portion, a dielectric film on the lower electrode to extend along the first region of the outer portion, and an upper electrode on the dielectric film, wherein the outer portion of the lower electrode includes a metal dopant, a concentration of the metal dopant in the first region of the outer portion being different from a concentration of the metal dopant in the second region of the outer portion.

20 Claims, 21 Drawing Sheets

SEMICONDUCTOR DEVICE AND METHOD OF FABRICATING THE SAME

CROSS-REFERENCE TO RELATED APPLICATIONS

Korean Patent Application No. 10-2019-0071903, filed on Jun. 18, 2019, in the Korean Intellectual Property Office, and entitled: "Semiconductor Device and Method of Fabricating the Same," is incorporated by reference herein in its entirety.

BACKGROUND

1. Field

The present disclosure relates to a semiconductor device and a method of fabricating the same, and more particularly, to a semiconductor device using capacitors as data storage elements and a method of fabricating the semiconductor device.

2. Description of the Related Art

In order to support the recent trends toward large-capacity and highly integrated semiconductor devices, the design rules and minimum feature sizes of semiconductor devices are continuously decreasing. Such trends are particularly applicable to semiconductor memory devices, e.g., dynamic random access memories (DRAMs). For example, in order for a DRAM to operate properly, each cell may be required to have capacitance that exceeds a predetermined level.

SUMMARY

According to an embodiment of the present disclosure, there is provided a semiconductor device including a landing pad on a substrate, a lower electrode on the landing pad and connected to the landing pad, the lower electrode including an outer portion, the outer portion including first and second regions, and an inner portion inside the outer portion, a dielectric film on the lower electrode to extend along the first region of the outer portion, and an upper electrode on the dielectric film, wherein the outer portion of the lower electrode includes a metal dopant, a concentration of the metal dopant in the first region of the outer portion being different from a concentration of the metal dopant in the second region of the outer portion.

According to another embodiment of the present disclosure, there is provided a semiconductor device including a landing pad disposed on a substrate, a lower electrode disposed on the landing pad and connected to the landing pad, and extending in a thickness direction of the substrate, at least one supporter pattern disposed in contact with part of the lower electrode, a dielectric film extending along outer surfaces of the lower electrode and outer surfaces of the at least one supporter pattern, and an upper electrode disposed on the dielectric film, wherein the lower electrode includes a metal dopant, the outer surfaces of the lower electrode are at least partially doped with the metal dopant, and a concentration of the metal dopant between the lower electrode and the dielectric film is higher than a concentration of the metal dopant between the lower electrode and the at least one supporter pattern.

According to yet another embodiment of the present disclosure, there is provided a semiconductor device including a landing pad disposed on a substrate, an etching stopper film disposed on the landing pad to expose part of the landing pad, a first supporter pattern disposed on the etching stopper film to be spaced apart from the etching stopper film and having a first thickness, a second supporter pattern disposed on the first supporter pattern to be spaced apart from the first supporter pattern and having a second thickness which is greater than the first thickness, a lower electrode disposed on the landing pad to be in contact with the etching stopper film, the first supporter pattern, and the second supporter pattern, a dielectric film extending along profiles of the lower electrode, the first supporter pattern, and the second supporter pattern, and an upper electrode disposed on the dielectric film, wherein the metal electrode includes a metal dopant, a sidewall of the lower electrode is at least partially doped with the metal dopant, and part of the sidewall of the lower electrode between the lower electrode and the second supporter pattern includes a portion that does not include the metal dopant.

According to still another embodiment of the present disclosure, there is provided a method of fabricating a semiconductor device, including forming a lower electrode on a landing pad, forming a supporter pattern to be in contact with part of a sidewall of the lower electrode, forming an interface layer, including a metal dopant, along profiles of the lower electrode and the supporter pattern, diffusing the metal dopant into the lower electrode through a thermal treatment process, removing the interface layer after the thermal treatment process, forming a dielectric film along the profiles of the lower electrode and the supporter pattern; and forming an upper electrode on the dielectric film.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
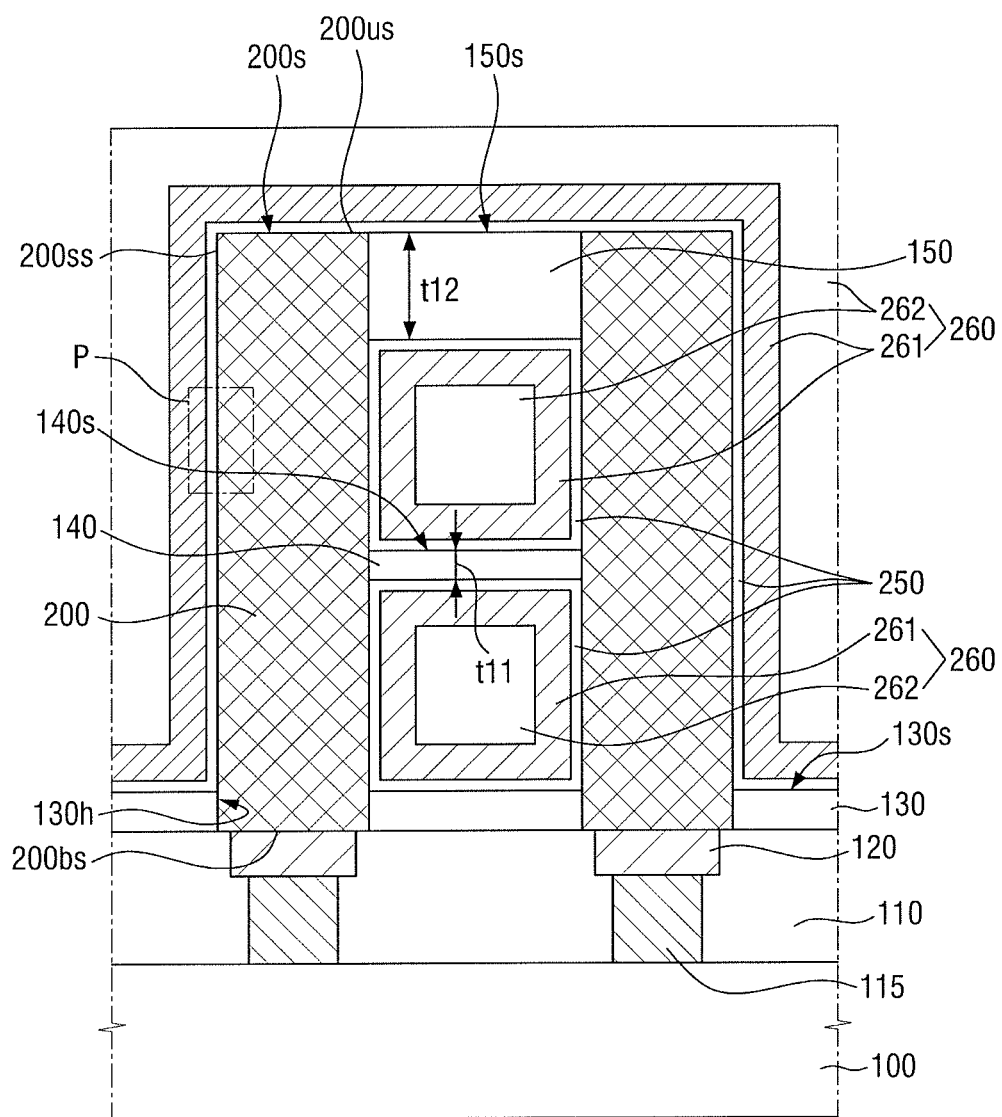
FIG. 1 illustrates a cross-sectional view of a semiconductor device according to some embodiments of the present disclosure.
Figure 1:
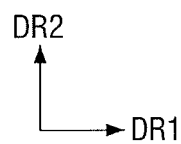
Figure 2:
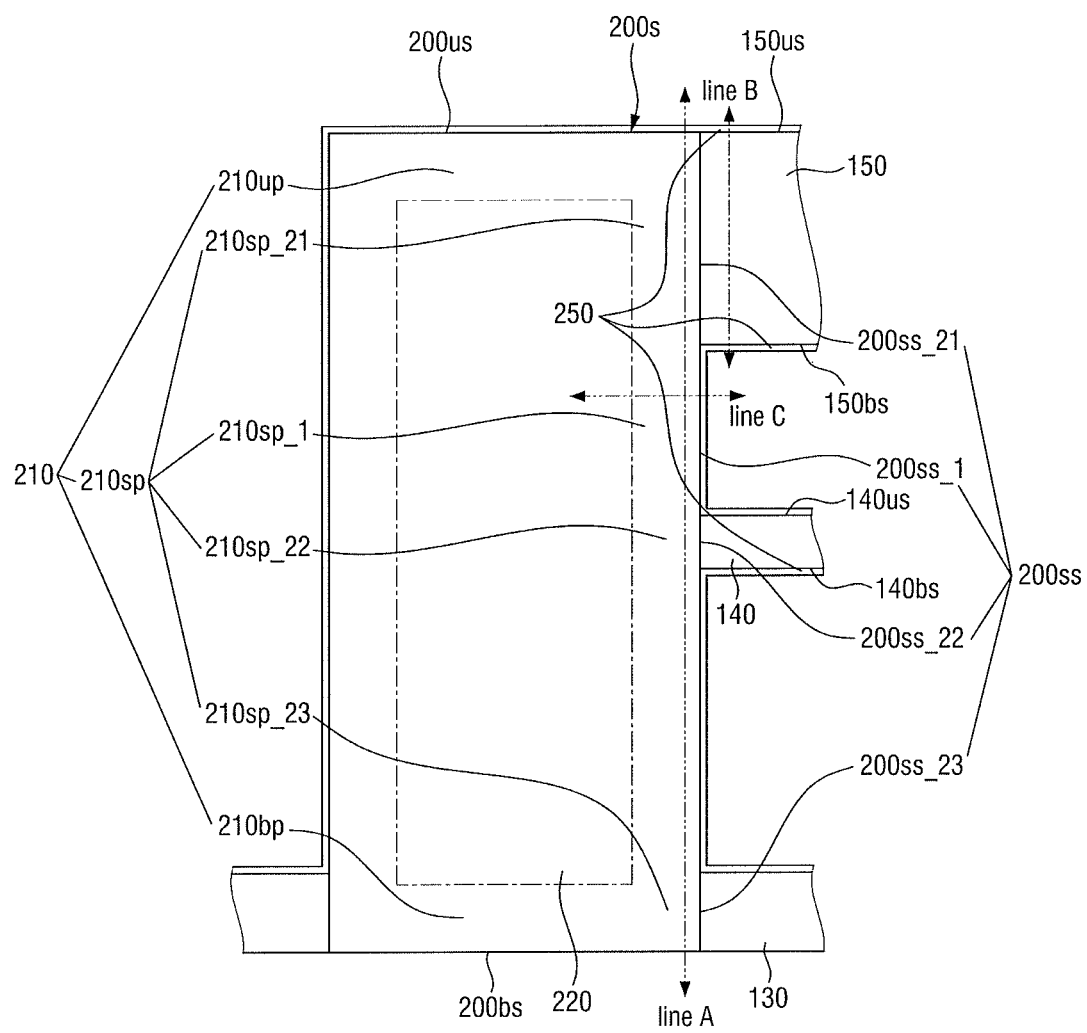
FIG. 2 illustrates an enlarged cross-sectional view of a lower electrode, supporter patterns, and an etching stopper film of FIG. 1.
Figure 3:
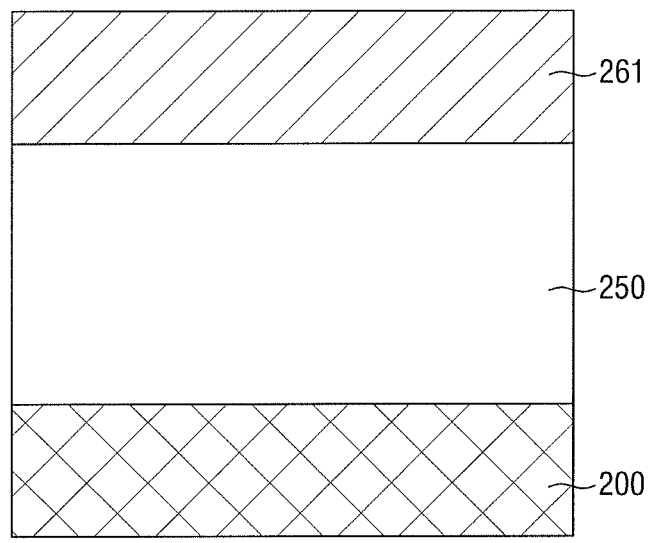
FIG. 3 illustrates an enlarged cross-sectional view of part P in FIG. 1.
Figure 4:
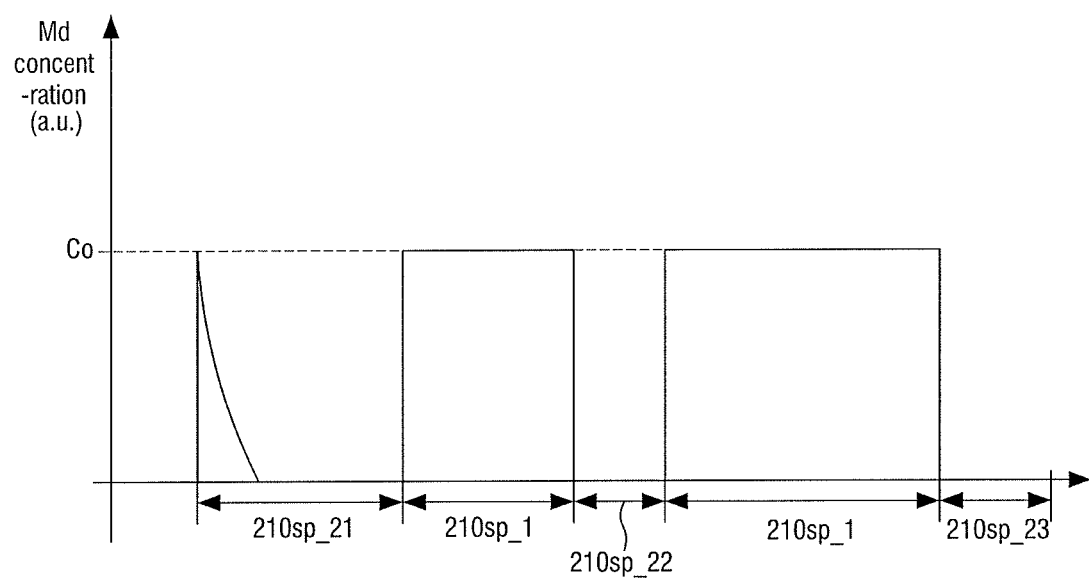
FIG. 4 illustrates a graph of the variation of the concentration of a metal dopant along line A of FIG. 2.
Figure 5:
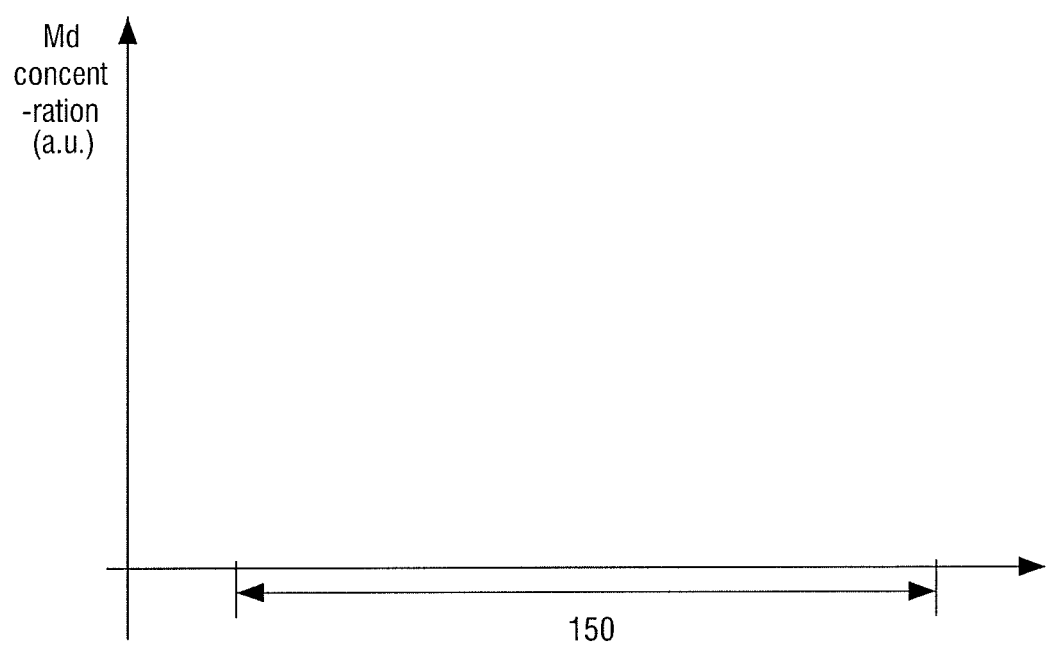
FIG. 5 illustrates a graph of the variation of the concentration of the metal dopant along line B of FIG. 2.
Figure 6:
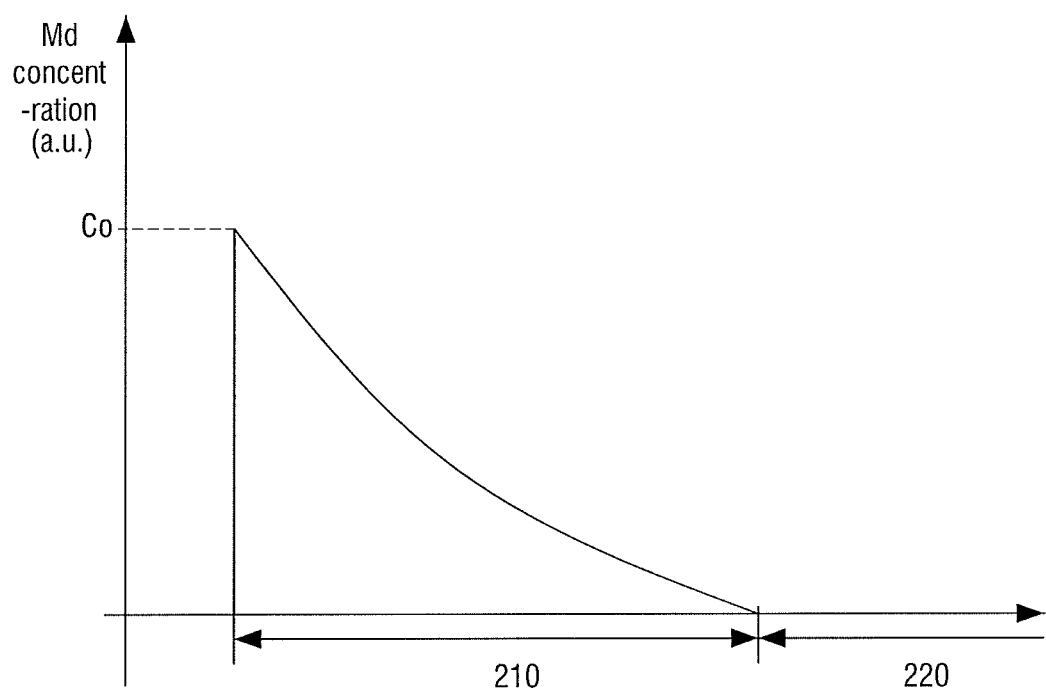
FIG. 6 illustrates a graph showing the variation of the concentration of the metal dopant along line C of FIG. 2.

FIG. 1 is a cross-sectional view illustrating a semiconductor device according to some embodiments of the present disclosure. FIG. 2 is a cross-sectional view illustrating a lower electrode, supporter patterns, and an etching stopper film of FIG. 1. FIG. 3 is an enlarged cross-sectional view of part P of FIG. 1. FIG. 4 is a graph showing the variation of the concentration of a metal dopant along line A of FIG. 2. FIG. 5 is a graph showing the variation of the concentration of the metal dopant along line B of FIG. 2. FIG. 6 is a graph showing the variation of the concentration of the metal dopant along line C of FIG. 2.

Referring to FIGS. 1 through 3, a semiconductor device according to some embodiments of the present disclosure may include a landing pad 120, an etching stopper film 130, a lower supporter pattern 140, an upper supporter pattern 150, a lower electrode 200, a capacitor dielectric film 250, and an upper electrode 260.

The landing pad 120 may be disposed on a substrate 100. The landing pad 120 may be connected to the substrate 100. The landing pad 120 may be electrically connected to a conductive region formed on or in the substrate 100.

The landing pad 120 may be connected to the substrate 100 via a storage contact 115. The landing pad 120 may be disposed on the storage contact 115.

An interlayer insulating film 110 may be disposed on the substrate 100. The storage contact 115 and the landing pad 120 may be disposed in the interlayer insulating film 110 on the substrate 100.

For example, the substrate 100 may be a bulk silicon substrate or silicon-on-insulator (SOI) substrate. In another example, the substrate 100 may be a silicon substrate or may include a material other than silicon, e.g., silicon germanium, silicon germanium-on-insulator (SGOI), indium antimonide, lead tellurium compound, indium arsenide, indium phosphide, gallium arsenide or gallium antimonide, but the present disclosure is not limited thereto. The substrate 100 will hereinafter be described as being a silicon substrate.

The interlayer insulating film 110 may include at least one of, e.g., silicon oxide, silicon nitride, silicon oxynitride (SiON), silicon oxycarbonitride (SiOCN), and a combination thereof.

The storage contact 115 may include at least one of, e.g., a semiconductor material doped with impurities, a conductive silicide compound, a conductive metal nitride, and a metal. The landing pad 120 may include at least one of, e.g., a semiconductor material doped with impurities, a conductive silicide compound, a conductive metal nitride, and a metal. For example, the landing pad 120 may include tungsten (W).

The etching stopper film 130 may be disposed on the interlayer insulating film 110. The etching stopper film 130 may at least partially expose the landing pad 120.

For example, the etching stopper film 130 may be disposed on the landing pad 120. The etching stopper film 130 may include a lower electrode hole 130h. The lower electrode hole 130h may at least partially expose the landing pad 120.

The etching stopper film 130 may include one of, e.g., silicon nitride, silicon carbonate (SiCO), silicon oxynitride, silicon carbonitride (SiCN), silicon oxynitride, and a combination thereof. The etching stopper film 130 may include silicon carbonitride or silicon nitride.

The lower electrodes 200 may be disposed on the landing pad 120. The lower electrode 200 may be connected to the landing pad 120.

The lower electrode 200 may extend in the thickness direction of the substrate 100, i.e., in a second direction DR2. The length by which the lower electrode 200 extends in the second direction DR2 may be greater than the length by which the lower electrode 200 extends in a first direction DR1. Alternatively, the length by which the lower electrode 200 extends in the second direction DR2 may be greater than the width, in the first direction DR1, of the lower electrode 200. The lower electrode 200 may be in the shape of, e.g., a pillar or a cylinder.

Here, the second direction DR2 may be a direction parallel to the thickness direction of the substrate 100, e.g., the second direction DR2 may extend along a normal to an upper surface of the substrate 100. The first direction DR1 may intersect the second direction DR2 and may be a direction parallel to the top surface of the substrate 100 or the top surface of the interlayer insulating film 110.

The lower electrode 200 may include outer surfaces 200s which define the shape of the lower electrode 200. The outer surfaces 200s may include a bottom surface 200bs which faces the top surface of the landing pad 120, a sidewall 200ss which extends in the second direction DR2, and a top surface 200us which faces, e.g., and is parallel to, the bottom surface 200bs. The sidewall 200ss may connect the bottom and top surfaces 200bs and 200us. For example, as illustrated in FIG. 1, two lower electrodes 200 may be adjacent to each other along the first direction DR1, such that each of the two lower electrodes 200 may be connected to a corresponding one landing pad 120. For example, as further illustrated in FIG. 1, the two lower electrodes 200 may be connected to each other by the lower and upper supporter patterns 140 and 150.

Part of the lower electrode 200 may be disposed in the lower electrode hole 130h. The lower electrode 200 may pass through the lower electrode hole 130h to be connected to the landing pad 120, e.g., a lower part of the lower electrode 200 may fill the lower electrode hole 130h and may directly contact the landing pad 120. For example, part of the sidewall 200ss of the lower electrode 200 may be in, e.g., direct, contact with the etching stopper film 130.

The lower electrode 200 may include, e.g., a doped semiconductor material, conductive metal nitride (e.g., titanium nitride, tantalum nitride, or tungsten nitride), a metal (e.g., ruthenium, iridium, titanium, or tantalum), or conductive metal oxide (e.g., iridium oxide), but the present disclosure is not limited thereto. The lower electrode 200 will hereinafter be described as including titanium nitride (TiN).

The lower electrode 200 may include a metal dopant. The inside and/or the outside of the lower electrode 200 may be doped with the metal dopant.

The metal dopant may include at least one of, e.g., tin (Sn), molybdenum (Mo), niobium (Nb), tantalum (Ta), indium (In), nickel (Ni), cobalt (Co), tungsten (W), titanium (Ti), vanadium (V), phosphorus (P), arsenic (As), antimony (Sb), bismuth (Bi), and ruthenium (Ru). The metal dopant may be different from the metal included in the lower electrode 200. For example, when the lower electrode 200 includes titanium nitride, the lower electrode 200 may be doped with any one of the aforementioned metal dopants other than titanium. The lower electrode 200 and the metal dopant will be described in more detail below.

The lower supporter pattern 140 may be disposed on the etching stopper film 130. The lower supporter pattern 140 may be spaced apart from the etching stopper film 130 in the second direction DR2. The lower supporter pattern 140 may be in, e.g., direct, contact with the lower electrode 200. The lower supporter pattern 140 may be in, e.g., direct, contact with part of the sidewall 200ss of the lower electrode 200. The lower supporter pattern 140 may include outer surfaces 140s which extend in the first direction DR1. The outer surfaces 140s of the lower supporter pattern 140 may include top and bottom surfaces 140us and 140bs which face each other, e.g., the top and bottom surfaces 140us and 140bs may be parallel to each other and to the bottom and top surfaces 200bs and 200us of the lower electrode 200.

The upper supporter pattern 150 may be disposed on the lower supporter pattern 140, e.g., the lower supporter pattern 140 may be between the substrate 100 and the upper supporter pattern 150. The upper supporter pattern 150 may be spaced apart from the lower supporter pattern 140 in the second direction DR2. The upper supporter pattern 150 may be in, e.g., direct, contact with the lower electrode 200. The upper supporter pattern 150 may be in, e.g., direct, contact with part of the sidewall 200ss of the lower electrode 200. The upper supporter pattern 150 may include outer surfaces 150s which extend in the first direction DR1. The outer surfaces 150s of the upper supporter pattern 150 may include top and bottom surfaces 150us and 150bs which face each other, e.g., the top and bottom surfaces 150us and 150bs may be parallel to each other and to the top and bottom surfaces 140us and 140bs of the lower supporter pattern 140.

For example, the top surface 150us of the upper supporter pattern 150 may be on the same plane as the top surface 200us of the lower electrode 200, e.g., the top surface 150us and the top surface 200us may be at a same distance from the top surface of the substrate 100 and may be level with each other. In another example, the top surface 150us of the upper supporter pattern 150 may protrude beyond, e.g., above, the top surface 200us of the lower electrode 200 in a direction oriented away from the substrate 100. The top surface 150us of the upper supporter pattern 150 will hereinafter be described as being on the same plane as the top surface 200us of the lower electrode 200.

The lower supporter pattern 140 and the upper supporter pattern 150 may include at least one of, e.g., silicon nitride, silicon carbonate, silicon oxynitride, silicon carbonitride, silicon oxynitride, and a combination thereof. For example, the lower supporter pattern 140 and the upper supporter pattern 150 may include silicon carbonitride or silicon nitride.

A thickness t11, in the second direction DR2, of the lower supporter pattern 140 may be different from a thickness t12, in the second direction DR2, of the upper supporter pattern 150. For example, as illustrated in FIG. 1, the thickness t11 of the lower supporter pattern 140 may be smaller than the thickness t12 of the upper supporter pattern 150.

For example, as illustrated in FIG. 1, the semiconductor device according to embodiments may include both the lower supporter pattern 140 and the upper supporter pattern 150. In another example, the semiconductor device according to embodiments may include only one of the lower supporter pattern 140 and the upper supporter pattern 150. In yet another example, the semiconductor device according to some embodiments may include a third supporter pattern in addition to the lower and upper supporter patterns 140 and 150.

The capacitor dielectric film 250 may be disposed on the lower electrode 200. The capacitor dielectric film 250 may be formed, e.g., conformally, along the outer surfaces 200s of the lower electrode 200, the outer surfaces 150s of the upper supporter pattern 150, and the top surface of the etching stopper film 130. The capacitor dielectric film 250 may extend along the profiles of the lower electrode 200, the upper supporter pattern 150, the lower supporter pattern 140, and the etching stopper film 130. For example, as illustrated in FIG. 1, the capacitor dielectric film 250 may be formed, e.g., conformally, along the outer surfaces 200s of two adjacent lower electrode 200 without being formed on surfaces of the two adjacent lower electrode 200 that face each other.

Since the lower supporter pattern 140 and the upper supporter pattern 150 are in, e.g., direct, contact with the lower electrode 200, the capacitor dielectric film 250 may not extend between the lower supporter pattern 140 and the lower electrode 200 and between the upper supporter pattern 150 and the lower electrode 200. Also, the capacitor dielectric film 250 may not extend between the etching stopper film 130 and the lower electrode 200.

The capacitor dielectric film 250 may be in, e.g., direct, contact with the lower electrode 200. The capacitor dielectric film 250 may be in, e.g., direct, contact with the outer surfaces 150s of the upper supporter pattern 150, the outer surfaces 140s of the lower supporter pattern 140, and the top surface 130s of the etching stopper film 130.

The capacitor dielectric film 250 may include at least one of, e.g., silicon oxide, silicon nitride, silicon oxynitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and a combination thereof, but the present disclosure is not limited thereto.

The capacitor dielectric film 250 is illustrated as being a single-layer film, but the present disclosure is not limited thereto. For example, the capacitor dielectric film 250 may have a stack structure in which zirconium oxide, aluminum oxide, and zirconium oxide are sequentially stacked.

In another example, the capacitor dielectric film 250 may have a stack structure in which a ferroelectric material film and a dielectric material film are stacked. The ferroelectric material film may have a ferroelectric characteristic. The ferroelectric material film may have a thickness enough to have a ferroelectric characteristic. The thickness of the ferroelectric material film may vary depending on the type of a ferroelectric material used to form the ferroelectric material film.

For example, the ferroelectric material film may include mono-metal oxide. The ferroelectric material film may include mono-metal oxide film. Here, the mono-metal oxide may be a binary compound including, e.g., consisting off, a single metal and oxygen.

For example, the metal included in the mono-metal oxide film may be hafnium (Hf), and the mono-metal oxide film may be a hafnium oxide (HfO) film. Here, the hafnium oxide film may have a chemical formula that does or does not conform to stoichiometry.

In another example, the metal included in the mono-metal oxide film may be a lanthanide-series rare-earth metal, and the mono-metal oxide film may be a lanthanide-series rare-earth metal oxide film. Here, the lanthanide-series rare-earth metal oxide film may have a chemical formula that does or does not conform to stoichiometry.

The ferroelectric material film may further include a dopant that the inside of the mono-metal oxide film is doped with. The doping concentration of the dopant may vary depending on the type of the dopant, but the doping concentration of the dopant may be 10% or less.

For example, when the mono-metal oxide film is a hafnium oxide film, the dopant that the inside of the mono-metal oxide film is doped with may include at least one of gadolinium (Gd), silicon (Si), aluminum (Al), yttrium (Y), lanthanum (La), scandium (Sc), cerium (Ce), dysprosium (Dy), tantalum, strontium (Sr), and niobium (Nb). In another example, when the mono-metal oxide film is a lanthanide-series rare-earth metal oxide film, the dopant that the inside of the mono-metal oxide film is doped with may include at least one of silicon, aluminum, hafnium, zirconium (Zr), and niobium.

Alternatively, the ferroelectric material film may not include the dopant that the inside of the mono-metal oxide film is doped with.

When the ferroelectric material film includes a mono-metal oxide film, the ferroelectric material film may have a thickness of, e.g., 1 nm or greater and 10 nm or less. For example, the ferroelectric material film may include bimetal oxide, e.g., a bimetal oxide film.

The bimetal oxide may be a ternary compound consisting of two metals and oxygen. The metals included in the bimetal oxide film may be, e.g., hafnium and zirconium. The bimetal oxide film may be a hafnium zirconium oxide ($Hf_xZr_{(1-x)}O$ where x is 0.2 or greater and 0.8 or less) film. The hafnium zirconium oxide film may have a chemical formula that does or does not conform to stoichiometry.

For example, the bimetal oxide film may further include a dopant that the inside of the bimetal oxide film is doped with. For example, the dopant may include at least one of gadolinium, silicon, aluminum, yttrium, lanthanum, scandium, cerium, dysprosium, tantalum, and strontium. In another example, the ferroelectric material film may not include the dopant that the inside of the bimetal oxide film is doped with.

When the ferroelectric material film includes the bimetal oxide film, the ferroelectric material film may have a thickness of, e.g., 1 nm or greater and 20 nm or less.

A dielectric material has a positive dielectric constant, and a ferroelectric material has a negative dielectric constant. That is, a dielectric material has a positive capacitance, and a ferroelectric material has a negative capacitance.

Generally, if two or more capacitors having positive capacitances are connected in series, the sum of the capacitances of the two or more capacitors decreases. However, if a capacitor having a negative capacitance and a capacitor having a positive capacitor are connected in series, the sum of the capacitances of the two capacitors increases.

The upper electrode 260 may be disposed on the capacitor dielectric film 250. The upper electrode 260 may include, e.g., first and second sub-upper electrodes 261 and 262. The first sub-upper electrode 261 may be formed along the profile of the capacitor dielectric film 250. The second sub-upper electrode 262 may be disposed on the first sub-upper electrode 261.

The first and second sub-upper electrodes 261 and 262 may include, e.g., a doped semiconductor material, a conductive metal nitride (e.g., titanium nitride, tantalum nitride, or tungsten nitride), a metal (e.g., ruthenium, iridium, titanium, niobium, nickel, copper (Cu), molybdenum, or tantalum), or a conductive metal oxide (e.g., iridium oxide or molybdenum oxide), but the present disclosure is not limited thereto. For example, the upper electrode 260 may include only one of the first and second sub-upper electrodes 261 and 262.

Referring to FIGS. 1 and 2, the lower electrode 200 may include an outer portion 210 and an inner portion 220 inside the outer portion 210. In this respect, it is noted that FIG. 2 illustrates the left lower electrode 200 of FIG. 1, while it is being connected to portions of the etching stopper film 130 (on the bottom) and the lower and upper supporter patterns 140 and 150 (above the etching stopper film 130). For example, as illustrated in FIG. 2, the outer portion 210 and inner portion 220 may be integral with each other, e.g., formed as one seamless electrode (the dashed line in FIG. 2 is an imaginary line between the outer and inner portions 210 and 220 illustrated merely for convenience).

As illustrated in FIG. 2, the outer portion 210 may surround the inner portion 220. The outer portion 210 may include the outer surfaces 200s of the lower electrode 200. The outer portion 210 may be defined as part of the lower electrode 200 that includes the outer surfaces 200s and has a thickness. Thus, the thickness of the outer portion 210 is not particularly limited, and the ratio of the thickness of the outer portion 210 to the width, in the first direction DR1, of the lower electrode 200 may be greater than zero and smaller than 0.5, e.g., a ratio of a total width of portion 210sp_1 along the first direction DR1 relative to a total width of the bottom portion 210bp along the first direction DR1 may be greater than 0 and smaller than 0.5.

The outer portion 210 may include a bottom portion 210bp, a top portion 210up, and a side portion 210sp. The side portion 210sp may be part of the outer portion 210 that extends from the bottom surface 200bs to the top surface 200us of the lower electrode 200, e.g., the side portion 210sp may include two identical portions along two opposite sidewalls 200ss of the lower electrode 200 and separated from each other by the inner portion 220.

The side portion 210sp may include the sidewall 200ss of the lower electrode 200. Since the side portion 210sp extends to the bottom surface 200bs of the lower electrode 200, the bottom portion 210bp may include part of the bottom surface 200bs of the lower electrode 200. Since the side portion 210sp also extends to the top surface 200us of the lower electrode 200, the top portion 210up may include part of the top surface 200us of the lower electrode 200.

The side portion 210sp may be in, e.g., direct, contact with the etching stopper film 130, the lower supporter pattern 140, and the upper supporter pattern 150. Part of the side portion 210sp that is in contact with none of the etching stopper film 130, the lower supporter pattern 140, and the upper supporter pattern 150 may be a first portion 210sp_1.

Part of the side portion 210sp that is in contact with the upper supporter pattern 150 may be a (2_1)-th portion 210sp_21. Part of the side portion 210sp that is in contact with the lower supporter pattern 140 may be a (2_2)-th portion 210sp_22. Part of the side portion 210sp that is in contact with the etching stopper film 130 may be a (2_3)-th portion 210sp_23. For example, as illustrated in FIG. 2, portion 210sp_1 may be between portions 210sp_21 and 210sp_22, and between portions 210sp_22 and 210sp_23. For example, as further illustrated in FIG. 2, portions 210sp_1 and 210sp_21 through 210sp_23 may have a same width along the first direction DR1, and may be continuous with each other.

As illustrated in FIGS. 1 and 2, the capacitor dielectric film 250 may extend along the top portion 210up and the first portion 210sp_1 of the side portion 210sp. The capacitor dielectric film 250 does not extend along the bottom portion 210*bp*, and does not extend along the (2_2)- and (2_3)-th portions 210*sp*_22 and 210*sp*_23 of the side portion 210*sp*, i.e., the capacitor dielectric film 250 does not extend between the outer portion 210 and each of the lower and upper supporter patterns 140 and 150.

A region in which the capacitor dielectric film 250 is formed may correspond to a first region of the outer portion 210. A region in which the capacitor dielectric film 250 is not formed may correspond to a second region of the outer portion 210. The (2_1)-th portion 210*sp*_21 of the side portion 210*sp* of the outer portion 210 may include the first and second regions of the outer portion 210, e.g., the (2_1)-th portion 210*sp*_21 of the side portion 210*sp* of the outer portion 210 may include the first region only where it overlaps with the top portion 210*up*.

Part of the sidewall 200*ss* of the lower electrode 200 that is in contact with none of the etching stopper film 130, the lower supporter pattern 140, and the upper supporter pattern 150 may be a first portion 200*ss*_1 of the sidewall 200*ss* of the lower electrode 200. Part of the sidewall 200*ss* of the lower electrode 200 that is in contact with the upper supporter pattern 150 may be a (2_1)-th portion 200*ss*_21 of the sidewall 200*ss* of the lower electrode 200. Part of the sidewall 200*ss* of the lower electrode 200 that is in contact with the lower supporter pattern 140 may be a (2_2)-th portion 200*ss*_22 of the sidewall 200*ss* of the lower electrode 200. Part of the sidewall 200*ss* of the lower electrode 200 that is in contact with the etching stopper film 130 may be a (2_3)-th portion 200*ss*_23 of the sidewall 200*ss* of the lower electrode 200.

The (2_1)-th portion 200*ss*_21 of the sidewall 200*ss* of the lower electrode 200 is the boundary between the lower electrode 200 and the upper supporter pattern 150. The (2_2)-th portion 200*ss*_22 of the sidewall 200*ss* of the lower electrode 200 is the boundary between the lower electrode 200 and the lower supporter pattern 140. The (2_3)-th portion 200*ss*_23 of the sidewall 200*ss* of the lower electrode 200 is the boundary between the lower electrode 200 and the etching stopper film 130.

The (2_1)-th portion 210*sp*_21 of the side portion 210*sp* includes the (2_1)-th portion 200*ss*_21 of the sidewall 200*ss* of the lower electrode 200. The (2_2)-th portion 210*sp*_22 of the side portion 210*sp* includes the (2_2)-th portion 200*ss*_22 of the sidewall 200*ss* of the lower electrode 200. The (2_3)-th portion 210*sp*_23 of the side portion 210*sp* includes the (2_3)-th portion 200*ss*_23 of the sidewall 200*ss* of the lower electrode 200.

The capacitor dielectric film 250 may extend along the first portion 200*ss*_1 of the sidewall 200*ss* of the lower electrode 200 and the top surface 200*us* of the lower electrode 200. The capacitor dielectric film 250 does not extend along the bottom surface 200*bs* of the lower electrode 200 and the (2_1)-, (2_2)-, and (2_3)-th portions 200*ss*_21, 200*ss*_22, and 200*ss*_23 of the sidewall 200*ss* of the lower electrode 200.

The region in which the capacitor dielectric film 250 is formed may correspond to the first region of the outer portion 210 of the lower electrode 200. The region in which the capacitor dielectric film 250 is not formed may correspond to the second region of the outer portion 210 of the lower electrode 200.

FIG. 4 shows the variation of the concentration of the metal dopant Md in the side portion 210*sp* of the outer portion 210 of the lower electrode 200. For example, the variation of the concentration of the metal dopant Md, as illustrated in FIG. 4, may be substantially the same as the variation of the concentration of the metal dopant Md in the sidewall 200*ss* of the lower electrode 200. FIG. 4 shows the variation of the concentration of the metal dopant Md in the side portion 210*sp* of the outer portion 210 of the lower electrode 200 ranging from the top surface 200*us* to the bottom surface 200*bs* of the lower electrode 200.

Referring to FIG. 4, the concentration of the metal dopant Md in the (2_1)-th portion 210*sp*_21 of the side portion 210*sp* of the outer portion 210 decreases away from the top surface 200*us* of the lower electrode 200. The concentration of the metal dopant Md may be zero in the (2_1)-th portion 210*sp*_21 of the side portion 210*sp* of the outer portion 210. The (2_1)-th portion 210*sp*_21 of the side portion 210*sp* of the outer portion 210 includes a first sub-region including the metal dopant Md and a second sub-region not including the metal dopant Md.

Here, the metal dopant concentration of zero does not necessarily mean that the metal dopant Md does not exist, but may mean that the (2_1)-th portion 210*sp*_21 of the side portion 210*sp* of the outer portion 210 is doped with the metal dopant Md to an amount less than a predetermined detection limit.

The concentration of the metal dopant Md may also be zero in the (2_2)- and (2_3)-th portions 210*sp*_22 and 210*sp*_23 of the side portion 210*sp* of the outer portion 210. The concentration of the metal dopant Md may be $C_0$ in the first portion 210*sp*_1 of the side portion 210*sp* of the outer portion 210, i.e., in the parts of the side portion 210*sp* facing, e.g., contacting, the capacitor dielectric film 250.

In other words, the concentration of the metal dopant Md in the (2_1)-th portion 200*ss*_21 of the sidewall 200*ss* of the lower electrode 200 decreases away from the top surface 200*us* of the lower electrode 200. The concentration of the metal dopant Md may be zero in the (2_1)-th portion 200*ss*_21 of the sidewall 200*ss* of the lower electrode 200. The (2_1)-th portion 200*ss*_21 of the sidewall 200*ss* of the lower electrode 200 may include a portion including the metal dopant Md and a portion not including the metal dopant Md.

The concentration of the metal dopant Md may also be zero in the (2_2)- and (2_3)-th portions 200*ss*_22 and 200*ss*_23 of the sidewall 200*ss* of the lower electrode 200. The concentration of the metal dopant Md may be $C_0$ in the first portion 200*ss*_1 of the sidewall 200*ss* of the lower electrode 200.

The concentration of the metal dopant Md in the top portion 210*up* of the outer portion 210 may be substantially the same as the concentration of the metal dopant Md in the first portion 210*sp*_1 of the side portion 210*sp* of the outer portion 210. Thus, the concentration of the metal dopant Md may be $C_0$ in the top portion 210*up* of the outer portion 210 or at the top surface 200*us* of the lower electrode 200.

At least part of the outer portion 210 of the lower electrode 200 may include the metal dopant Md. The outer portion 210 of the lower electrode 200 may include regions doped with the metal dopant Md and regions not doped with the metal dopant Md.

The capacitor dielectric film 250 may extend along the first portion 210*sp*_1 of the side portion 210*sp* of the outer portion 210. However, the capacitor dielectric film 250 does not extend along the (2_2)- and (2_3)-th portions 210*sp*_22 and 210*sp*_23 of the side portion 210*sp* of the outer portion 210.

The concentration of the metal dopant Md in the first portion 210*sp*_1 of the side portion 210*sp* of the outer portion 210 may differ from the concentrations of the metal dopant Md in the (2_1)-, (2_2)-, and (2_3)-th portions 210*sp*_21, 210*sp*_22, and 210*sp*_23 of the side portion 210*sp* of the outer portion 210. For example, the concentration of the metal dopant Md in the first portion 210*sp*_1 of the side portion 210*sp* of the outer portion 210 may be higher than the concentrations of the metal dopant Md in the (2_1)-, (2_2)-, and (2_3)-th portions 210*sp*_21, 210*sp*_22, and 210*sp*_23 of the side portion 210*sp* of the outer portion 210.

The concentration of the metal dopant Md compared between different regions may be the average concentration of the metal dopant Md. That is, there may exist part of the (2_1)-th portion 210*sp*_21 of the side portion 210*sp* of the outer portion 210 where the concentration of the metal dopant Md is particularly high, but the average concentration of the metal dopant Md may be lower in the (2_1)-th portion 210*sp*_21 of the side portion 210*sp* of the outer portion 210 than in the first portion 210*sp*_1 of the side portion 210*sp* of the outer portion 210.

The lower electrode 200 may include the metal dopant Md, and at least some of the outer surfaces 200*s* of the lower electrode 200 may be doped with the metal dopant Md. The outer surfaces 200*s* of the lower electrode 200 may include regions doped with the metal dopant Md and regions not doped with the metal dopant Md.

The concentration of the metal dopant Md may be higher in the first portion 200*ss*_1 of the sidewall 200*ss* of the lower electrode 200 than in the (2_1)-, (2_2)-, and (2_3)-th portions 200*ss*_21, 200*ss*_22, and 200*ss*_23 of the sidewall 200*ss* of the lower electrode 200.

In other words, the concentration of the metal dopant Md between the lower electrode 200 and the capacitor dielectric film 250, i.e., Co, may be higher than the concentrations of the metal dopant Md between the lower electrode 200 and the upper supporter pattern 150, between the lower electrode 200 and the lower supporter pattern 140, and between the lower electrode 200 and the etching stopper film 130.

Referring to FIG. 5, the upper supporter pattern 150 may not include the metal dopant Md. The inside of the upper supporter pattern 150 may not be doped with the metal dopant Md. Similarly, the lower supporter pattern 140 and the etching stopper film 130 may not include the metal dopant Md.

FIG. 6 shows the variation of the concentration of the metal dopant Md in the first portion 210*sp*_1 of the side portion 210*sp* of the outer portion 210 where the capacitor dielectric film 250 is formed. The concentration of the metal dopant Md in the outer portion 210 of the lower electrode 200 decreases away from the outer surfaces 200*s* of the lower electrode 200, e.g., decreases in a direction oriented toward the inner portion 220.

FIG. 6 illustrates that the outer portion 210 of the lower electrode 200 includes the metal dopant Md and the inner portion 220 of the lower electrode 200 does not include the metal dopant Md, but the present disclosure is not limited thereto.

Figure 7:
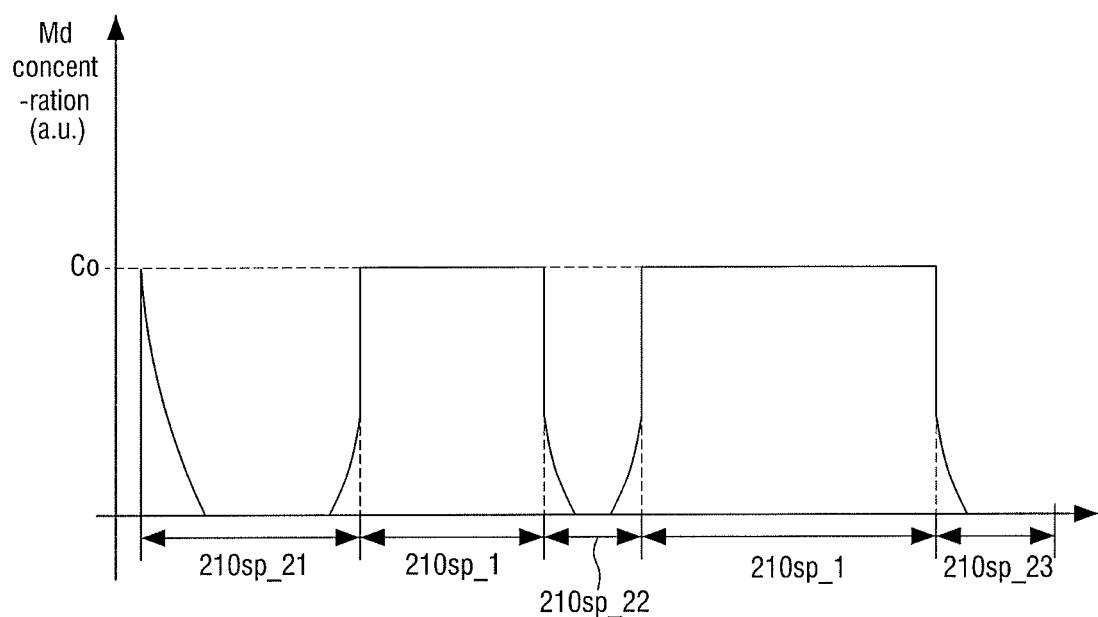
FIG. 7 illustrates a semiconductor device according to some embodiments of the present disclosure.
Figure 8:
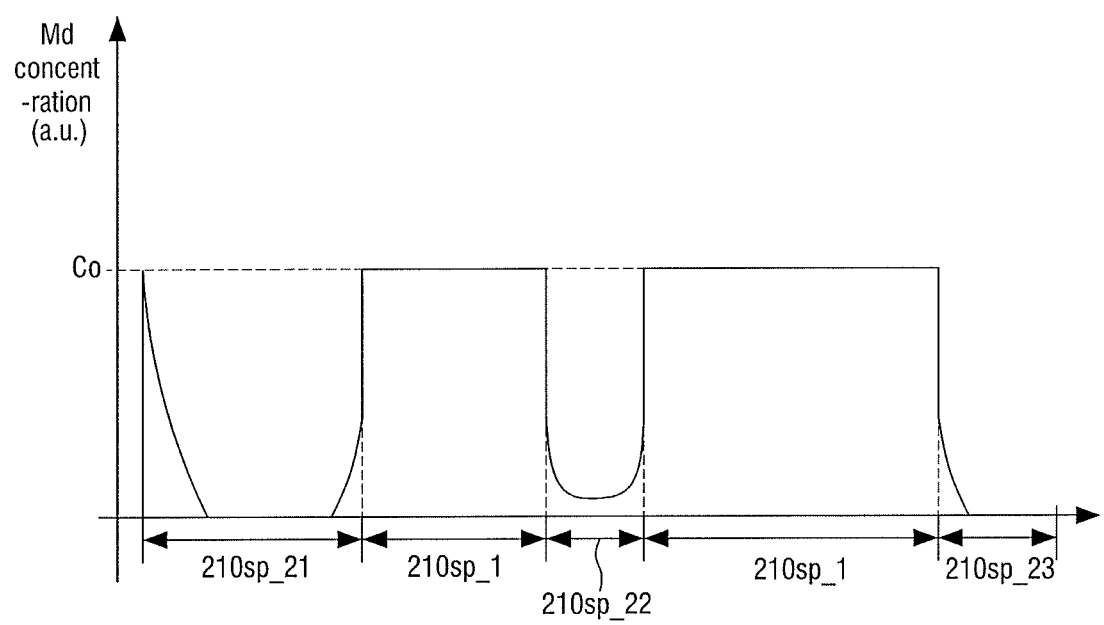
FIG. 8 illustrates a semiconductor device according to some embodiments of the present disclosure.

FIG. 7 illustrates a semiconductor device according to some embodiments of the present disclosure. FIG. 8 illustrates a semiconductor device according to some embodiments of the present disclosure. The semiconductor devices of FIGS. 7 and 8 will hereinafter be described, focusing mainly on differences with the semiconductor device of FIGS. 1 through 6.

In detail, FIG. 7 is a graph showing the variation of the concentration of a metal dopant, along line A of FIG. 2, in a semiconductor device according to some embodiments of the present disclosure, and FIG. 8 is a graph showing the variation of the concentration of a metal dopant, along line A of FIG. 2, in a semiconductor device according to some embodiments of the present disclosure.

Referring to FIG. 7, parts of (2_2)- and (2_3)-th portions 210*sp*_22 and 210*sp*_23 of the side portion 210*sp* of the outer portion 210 of the lower electrode 200 may include the metal dopant Md. The (2_2)- and (2_3)-th portions 210*sp*_22 and 210*sp*_23 of the side portion 210*sp* of the outer portion 210 include regions including the metal dopant Md and regions not including the metal dopant Md. Parts of (2_2)- and (2_3)-th portions 200*ss*_22 and 200*ss*_23 of the sidewall 200*ss* of the lower electrode 200 may include the metal dopant Md.

Referring to FIG. 8, the (2_2)-th portion 210*sp*_22 of the side portion 210*sp* of the outer portion 210 of the lower electrode 200 may generally include the metal dopant Md. The (2_2)-th portion 200*ss*_22 of the sidewall 200*ss* of the lower electrode 200 may generally include the metal dopant Md. The (2_2)-th portion 200*ss*_22 of the sidewall 200*ss* of the lower electrode 200 may be generally doped with the metal dopant Md.

Figure 9:
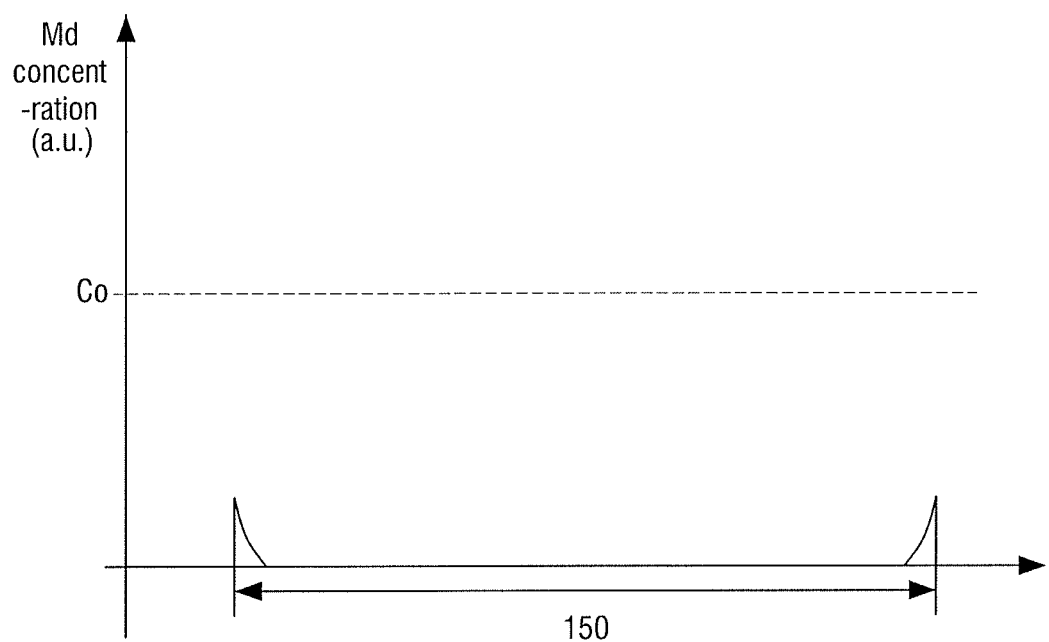
FIG. 9 illustrates a semiconductor device according to some embodiments of the present disclosure.

FIG. 9 illustrates a semiconductor device according to some embodiments of the present disclosure. The semiconductor device of FIG. 9 will hereinafter be described, focusing mainly on differences with the semiconductor device of FIGS. 1 through 6.

Specifically, FIG. 9 is a graph showing the variation of the concentration of a metal dopant, along line B of FIG. 2, in a semiconductor device according to some embodiments of the present disclosure.

Referring to FIG. 9, the upper supporter pattern 150 may include the metal dopant Md. The upper supporter pattern 150 may include the metal dopant MD, and outer surfaces 150*s* of the upper supporter pattern 150 may be doped with the metal dopant Md.

The concentration of the metal dopant MD at the outer surfaces 150*s* of the upper supporter pattern 150 may be lower than the concentration (i.e., Co) of the metal dopant Md in the first portion 200*ss*_1 of the sidewall 200*ss* of the lower electrode 200, which is the boundary between the lower electrode 200 and a capacitor dielectric film 250.

Although not specifically illustrated, the lower supporter pattern 140 may include the metal dopant Md, and outer surfaces 140*s* of the lower supporter pattern 140 may be doped with the metal dopant Md. The etching stopper film 130 may include the metal dopant Md, and a top surface 130*s* of the etching stopper film 130 may be doped with the metal dopant Md.

The concentration of the metal dopant Md at the outer surfaces 140*s* of the lower supporter pattern 140 and at the top surface 130*s* of the etching stopper film 130 may be lower than the concentration of the metal dopant Md in the first portion 200*ss*_1 of the sidewall 200*ss* of the lower electrode 200, i.e., $C_0$.

The outer surfaces 150*s* of the upper supporter pattern 150, the outer surfaces 140*s* of the lower supporter pattern 140, and/or the top surface 130*s* of the etching stopper film 130 may include the metal dopant Md.

Figure 10:
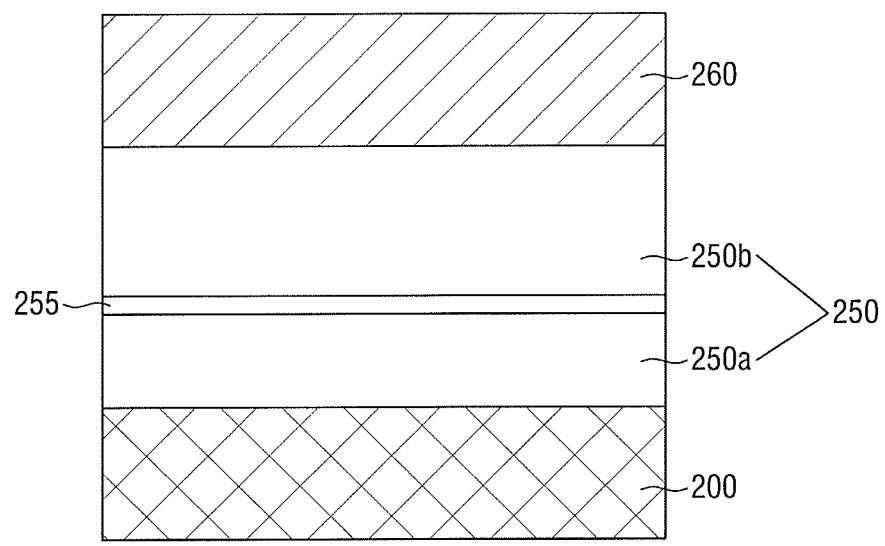
FIG. 10 illustrates a semiconductor device according to some embodiments of the present disclosure.
Figure 11:
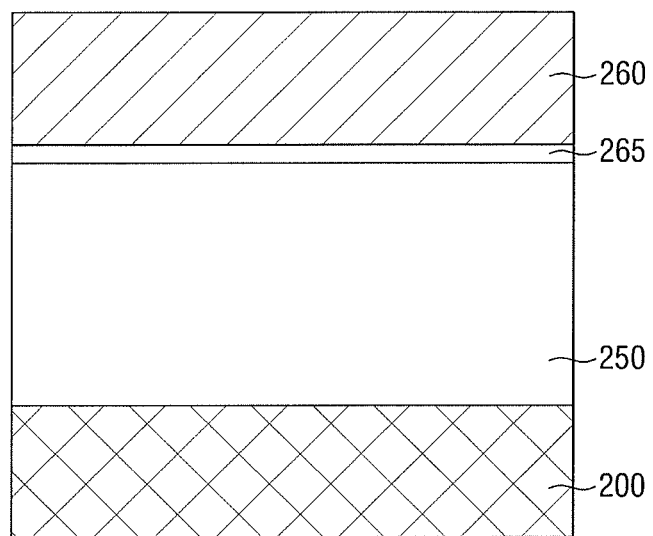
FIG. 11 illustrates a semiconductor device according to some embodiments of the present disclosure.

FIG. 10 illustrates a semiconductor device according to some embodiments of the present disclosure. FIG. 11 illustrates a semiconductor device according to some embodiments of the present disclosure. The semiconductor devices of FIGS. 10 and 11 will hereinafter be described, focusing mainly on differences with the semiconductor device of FIGS. 1 through 6.

In detail, FIGS. 10 and 11 are enlarged cross-sectional views of parts of semiconductor devices according to some embodiments of the present disclosure that correspond to the part enclosed by dotted lines of FIG. 1.

Referring to FIG. 10, the semiconductor device according to some embodiments of the present disclosure may further include an insertion film 255 which is disposed between the lower electrode 200 and the upper electrode 260. The insertion film 255 may be disposed inside the capacitor dielectric film 250.

The insertion film 255 may promote the crystallization of the capacitor dielectric film 250. The capacitor dielectric film 250 may be divided into first and second portions 250a and 250b by the insertion film 255. The insertion film 255 may be in contact with the first and second portions 250a and 250b of the capacitor dielectric film 250.

The insertion film 255 may include at least one of, e.g., titanium (Ti), niobium (Nb), molybdenum (Mo), tin nitride, and tin oxide. Alternatively, the insertion film 255 may include at least one of ruthenium and ruthenium oxide.

Referring to FIG. 11, the semiconductor device according to some embodiments of the present disclosure may further include a passivation film 265 which is disposed between the capacitor dielectric film 250 and the upper electrode 260. The passivation film 265 may prevent oxygen atoms included in the capacitor dielectric film 250 from moving to the upper electrode 260.

The passivation film 265 may include metal oxide. The passivation film 265 may include at least one of, e.g., titanium oxide, tantalum oxide, molybdenum oxide, tin oxide, and niobium oxide.

Figure 12:
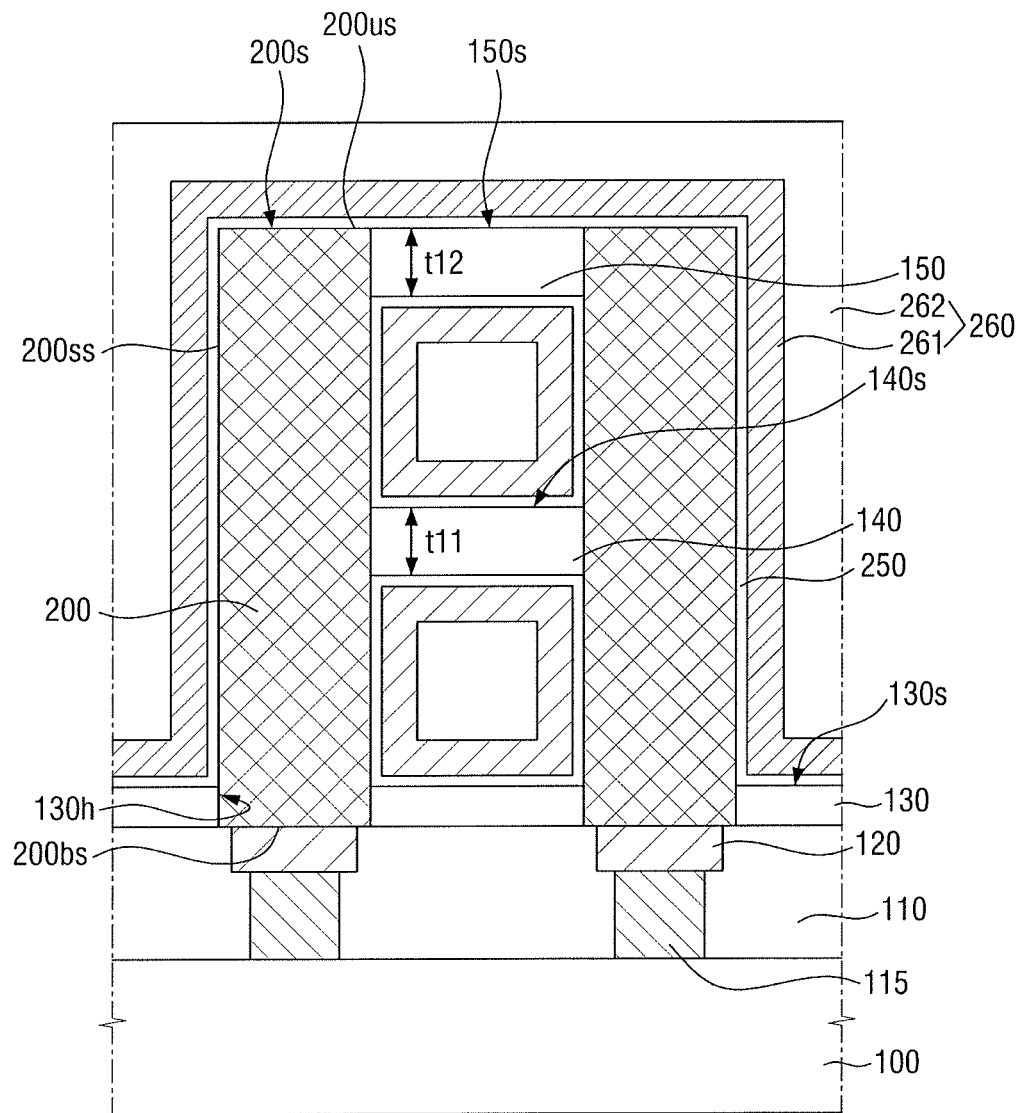
FIG. 12 illustrates a semiconductor device according to some embodiments of the present disclosure.
Figure 13:
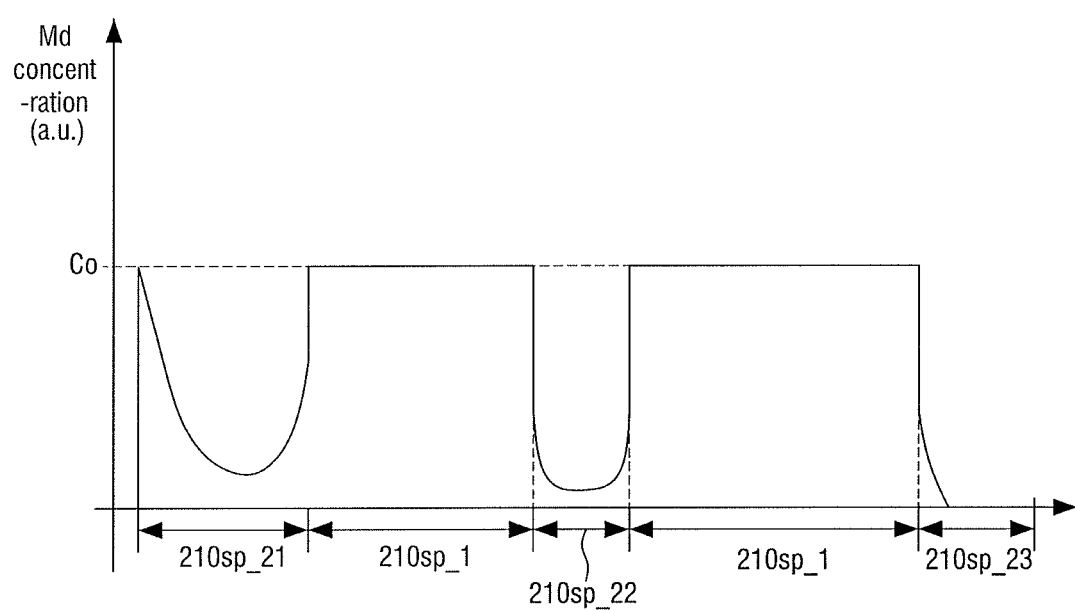
FIG. 13 illustrates a graph of the variation of the concentration of a metal dopant near the outer surfaces of a lower electrode of the semiconductor device of FIG. 12.

FIG. 12 illustrates a semiconductor device according to some embodiments of the present disclosure. FIG. 13 is a graph showing the variation of the concentration of a metal dopant near the outer surfaces of a lower electrode of the semiconductor device of FIG. 12. The semiconductor device of FIG. 12 will hereinafter be described, focusing mainly on differences with the semiconductor device of FIGS. 1 through 6.

In detail, FIG. 13 is a graph showing the variation of the concentration of a metal dopant, along line A of FIG. 2, in the semiconductor device of FIG. 12.

Referring to FIGS. 2, 12, and 13, the (2_1)- and (2_2)-th portions 210sp_21 and 210sp_22 of the side portion 210sp of the outer portion 210 of the lower electrode 200 may generally include a metal dopant Md. The (2_1)- and (2_2)-th portions 200ss_21 and 200ss_22 of the sidewall 200ss of the lower electrode 200 may generally include the metal dopant Md. The (2_1)-th portion 200ss_21 of the sidewall 200ss of the lower electrode 200 may be generally doped with the metal dopant Md. The (2_2)-th portion 200ss_22 of the sidewall 200ss of the lower electrode 200 may be generally doped with the metal dopant Md.

Figure 14:
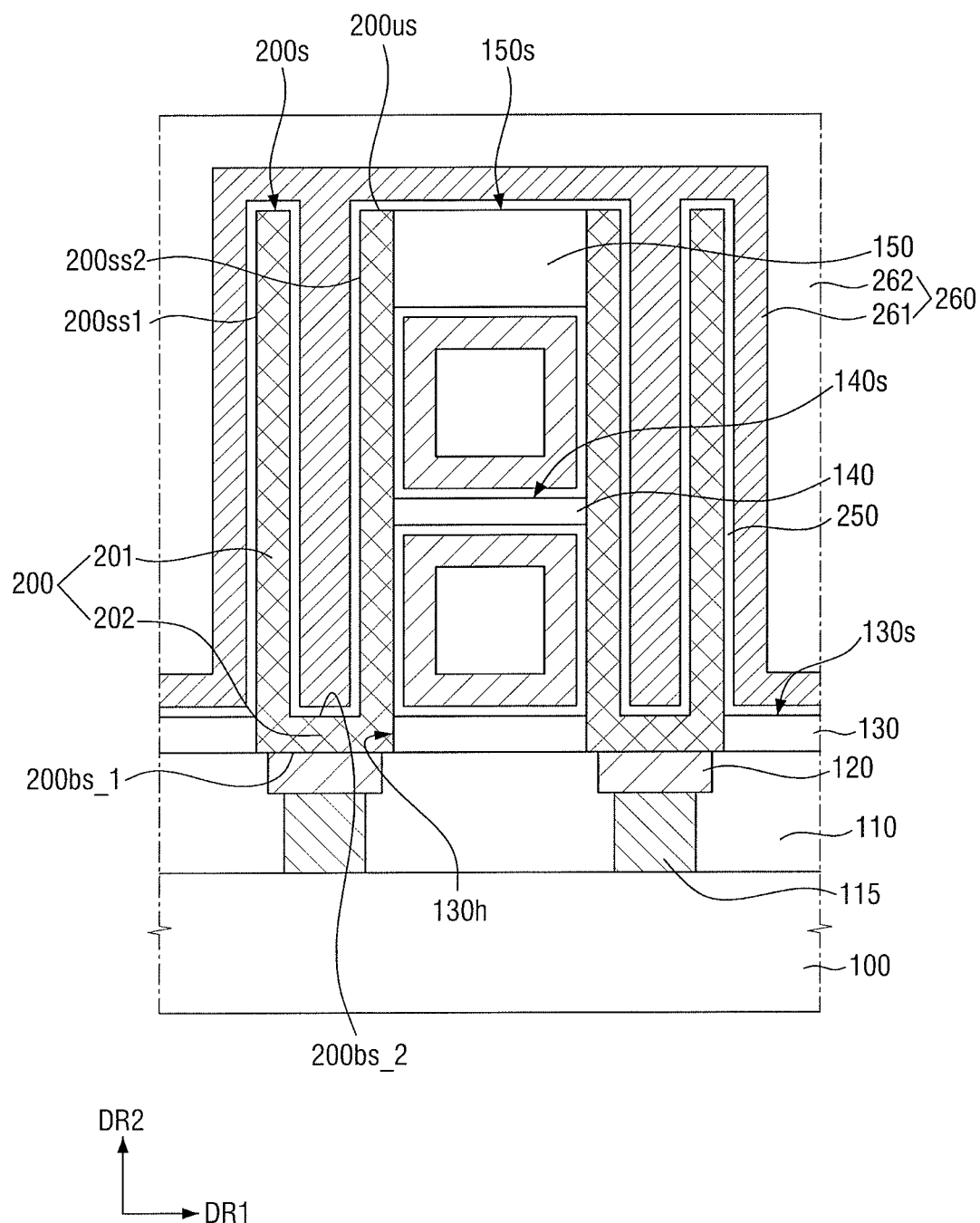
FIG. 14 illustrates a semiconductor device according to some embodiments of the present disclosure.

FIG. 14 illustrates a semiconductor device according to some embodiments of the present disclosure. The semiconductor device of FIG. 14 will hereinafter be described, focusing mainly on differences with the semiconductor device of FIGS. 1 through 6.

Referring to FIG. 14, the lower electrode 200 may include a bottom portion 202 which extends along the top surface of a landing pad 120 and a sidewall portion 201 which protrudes from the bottom portion 202. The sidewall portion 202 of the lower electrode 200 may extend in a second direction DR2.

Outer surfaces 200s of the lower electrode 200 may include first and second sidewalls 200ss1 and 200ss2. The outer surfaces 200s of the lower electrode 200 may further include a top surface 200us which connects the first and second sidewalls 200ss1 and 200ss2. The outer surfaces 200s of the lower electrode 200 may further include a first bottom surface 200bs_1 which is connected to the first sidewall 200ss1 and a second bottom surface 200bs_2 which is connected to the second sidewall 200ss2. The lower electrode 200 may be in the shape of a container.

The etching stopper film 130, the lower supporter pattern 140, and the upper supporter pattern 150 may be in contact with the first sidewall 200ss1 of the lower electrode 200.

The capacitor dielectric film 250 may extend along the first and second sidewalls 200ss1 and 200s2 of the lower electrode 200. The bottom portion 202 of the lower electrode 200 may include the outer portion 210 and the inner portion 220. The sidewall portion 201 of the lower electrode 200 may also include the outer portion 210 and the inner portion 220.

For example, the ratio of the thickness of the outer portion 210 of the lower electrode 200 to the width, in the first direction DR1, of the sidewall portion 201 of the lower electrode 200 may be greater than 0 and smaller than 0.5. The width, in the first direction DR1, of the sidewall portion 201 of the lower electrode 200 may be the distance between the first and second sidewalls 200ss1 and 200ss2 of the lower electrode 200 that face each other.

Figure 15:
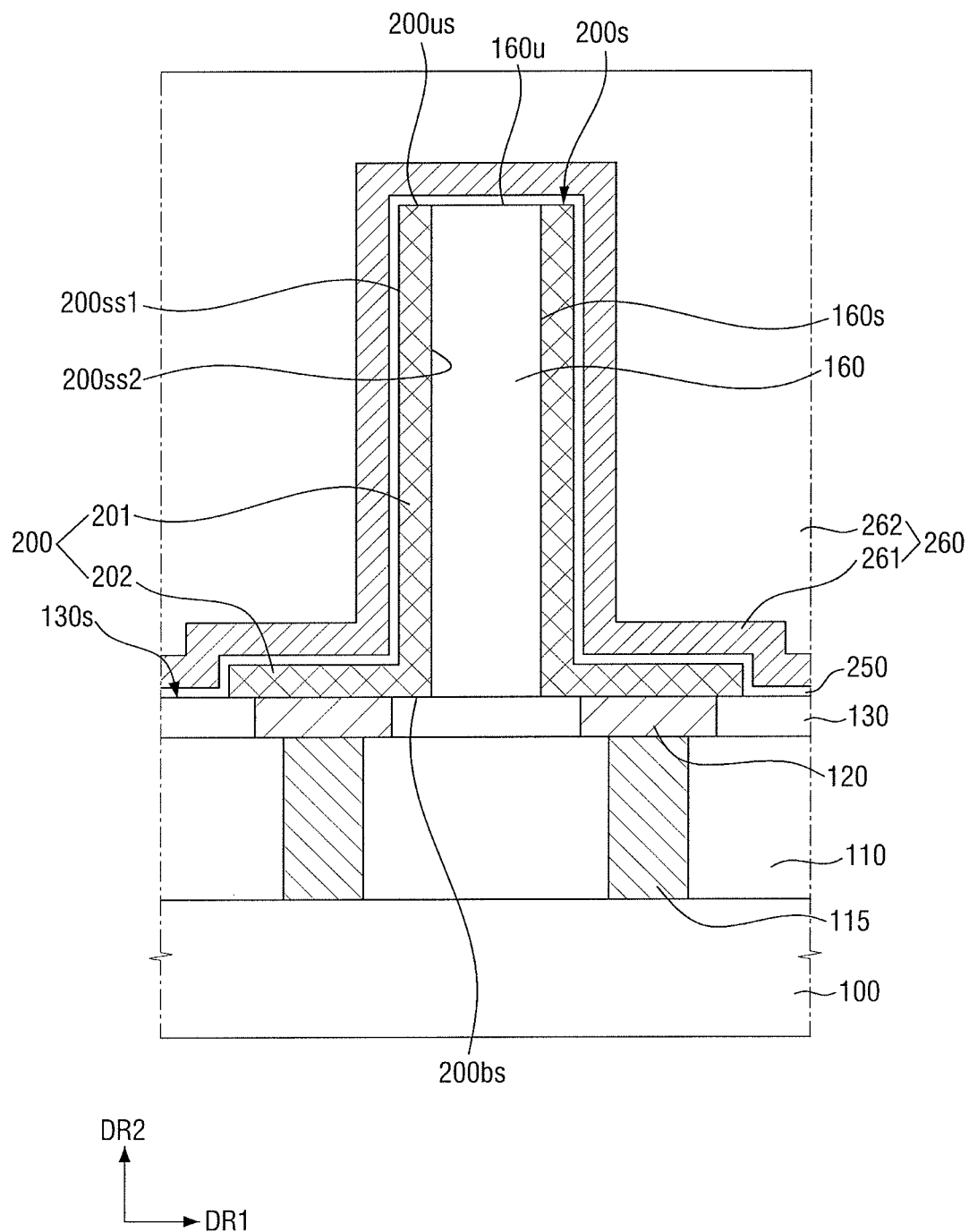
FIG. 15 illustrates a semiconductor device according to some embodiments of 1 the present disclosure.

FIG. 15 illustrates a semiconductor device according to some embodiments of the present disclosure. The semiconductor device of FIG. 15 will hereinafter be described, focusing mainly on differences with the semiconductor device of FIGS. 1 through 6.

Referring to FIG. 15, the semiconductor device according to some embodiments of the present disclosure may further include an insulating pattern 160 which is in contact with the lower electrode 200 and extends in the second direction DR2. The insulating pattern 160 may be disposed on the etching stopper film 130. The insulating pattern 160 may include a sidewall 160s and a top surface 160u.

The landing pad 120 may be disposed in the etching stopper film 130. The lower electrode 200 may be disposed on the etching stopper film 130.

The lower electrode 200 may include the bottom portion 202 which extends along the top surface of the landing pad 120 and the sidewall portion 201 which protrudes from the bottom portion 202. The sidewall portion 202 of the lower electrode 200 may extend in the second direction DR2. The sidewall portion 202 of the lower electrode 200 may extend along the sidewall 160s of the insulating pattern 160.

Outer surfaces 200s of the lower electrode 200 may include first and second sidewalls 200ss1 and 200ss2. The second sidewall 200ss2 may face the sidewall 160s of the insulating pattern 160. The outer surfaces 200s of the lower electrode 200 may further include a top surface 200us which connects the first and second sidewalls 200ss1 and 200ss2. The outer surfaces 200s of the lower electrode 200 may further include a bottom surface 200bs which is connected to the second sidewall 200ss2 and faces a top surface 130s of the etching stopper film 130 and the top surface of the landing pad 120.

The capacitor dielectric film 250 may extend along the first sidewall 200ss1 of the lower electrode 200, but not along the second sidewall 200ss2 of the lower electrode 200. The capacitor dielectric film 250 is not disposed between the second sidewall 200ss2 of the lower electrode 200 and the sidewall 160s of the insulating pattern 160. The capacitor dielectric film 250 may extend along the top surface 160u of the insulating pattern 160.

For example, the ratio of the thickness of an outer portion 210 of the lower electrode 200 to the width, in the first direction DR1, of the sidewall portion 201 of the lower electrode 200 may be greater than zero and smaller than 0.5.

The concentration of a metal dopant may be lower at the first sidewall 200ss1 than at the second sidewall 200ss2 of the lower electrode 200. The second sidewall 200ss2 of the lower electrode 200 may include a region doped with the metal dopant and a region not doped with the metal dopant.

FIGS. 16 through 21 are cross-sectional views illustrating stages in a method of fabricating a semiconductor device according to some embodiments of the present disclosure.

Figure 16:
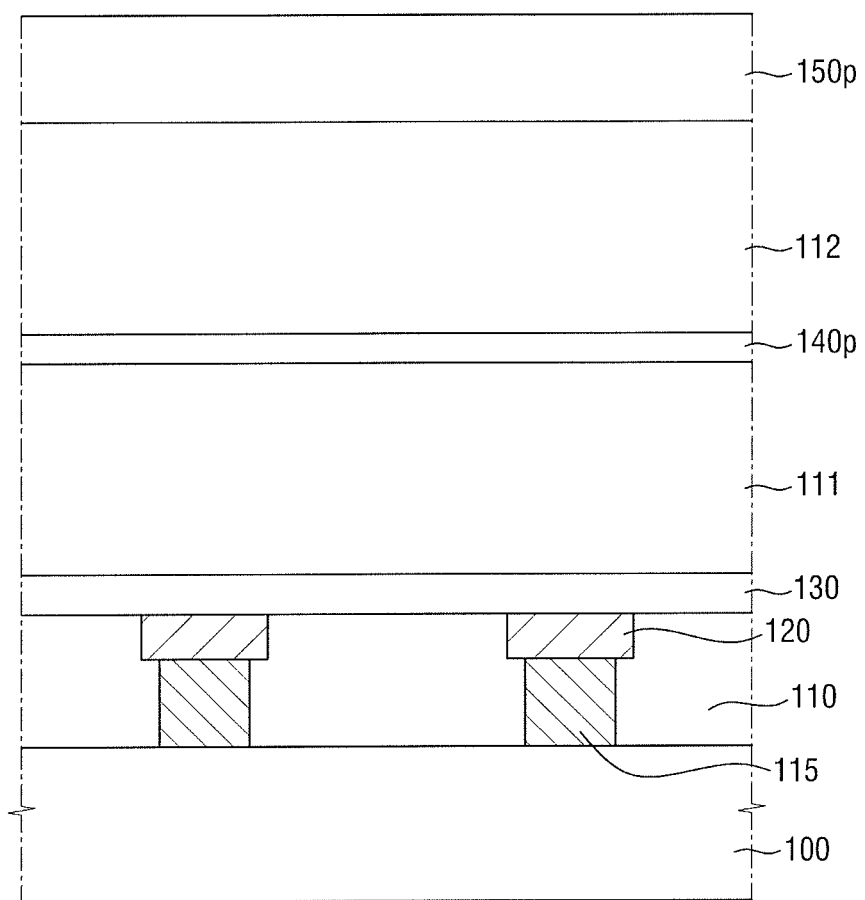
FIGS. 16 through 21 illustrate cross-sectional views of stages in a method of fabricating a semiconductor device according to some embodiments.

Referring to FIG. 16, the storage contacts 115 and the landing pads 120 may be formed in the interlayer insulating film 110 on the substrate 100. The etching stopper film 130, a lower mold film 111, a lower supporter film 140p, an upper mold film 112, and an upper supporter film 150p may be sequentially formed on the interlayer insulating film 110.

Figure 17:
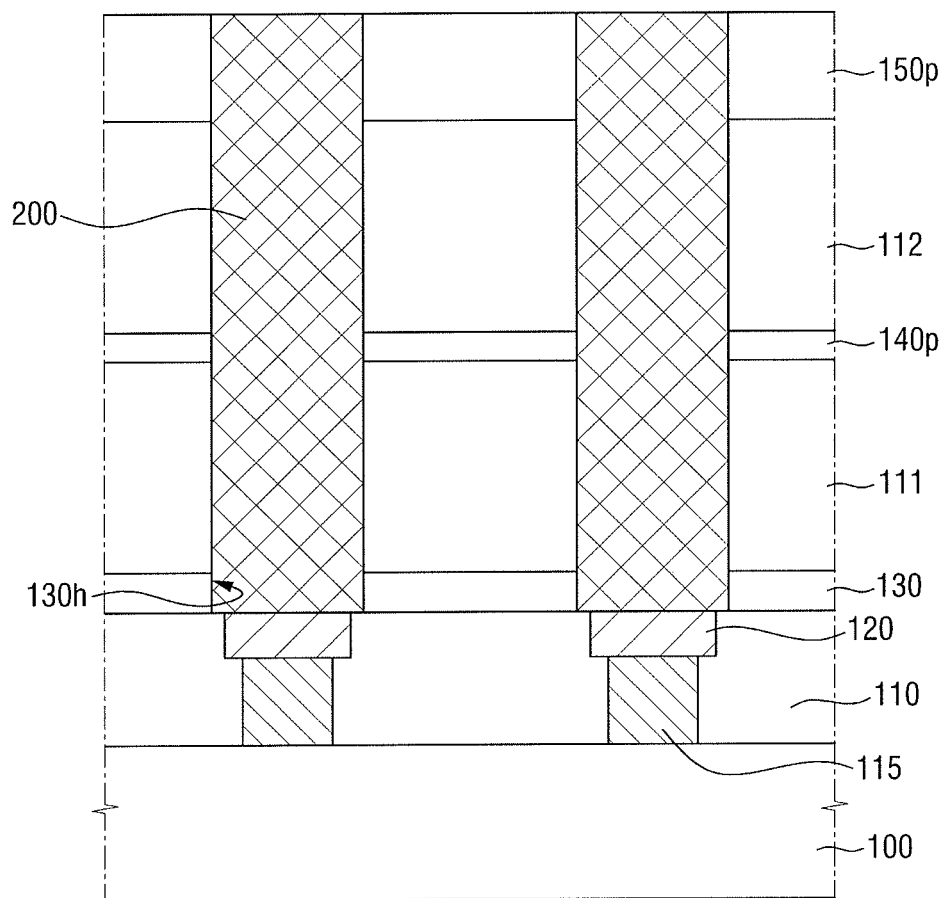

Referring to FIG. 17, the lower electrodes 200 may be formed on the landing pads 120 to penetrate the etching stopper film 130, the lower mold film 111, the lower supporter film 140p, the upper mold film 112, and the upper supporter film 150p. Parts of the lower electrodes 200 may be disposed in the lower electrode holes 130h included in the etching stopper film 130.

Figure 18:
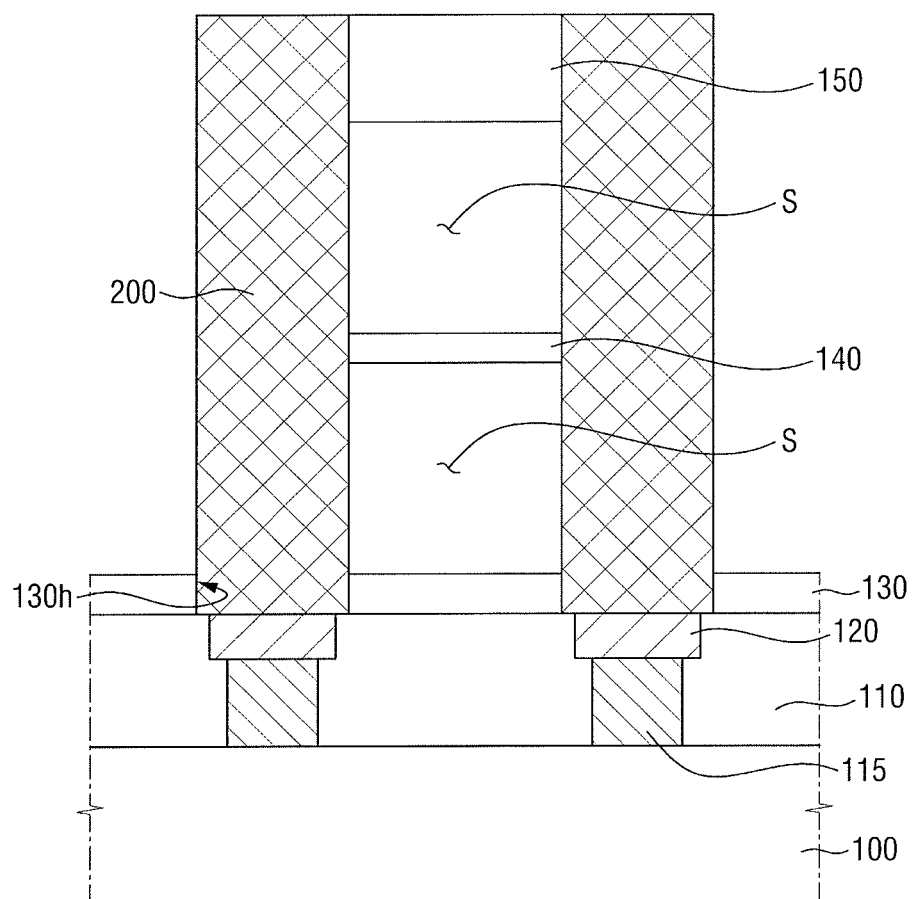

Referring to FIG. 18, the upper supporter pattern 150 and the lower supporter pattern 140 may be formed to connect the lower electrodes 200, which are adjacent to each other along the first direction DR1. The upper supporter pattern 150 and the lower supporter pattern 140 may be in, e.g., direct, contact with parts of the sidewalls of the lower electrodes 200.

The upper supporter pattern 150 may be formed by removing parts of the upper supporter film 150p, e.g., portions of the upper supporter film 150p on outer sidewalls of the lower electrodes 200 may be removed to maintain only the upper supporter pattern 150 connecting sidewalls of the adjacent lower electrodes 200 that face each other. The upper mold film 112 may be, e.g., completely, removed using regions where the upper supporter pattern 150 is not formed.

Thereafter, the lower supporter pattern 140 may be formed by removing part of the lower supporter film 140p, e.g., portions of the lower supporter film 140p on outer sidewalls of the lower electrodes 200 may be removed to maintain only the lower supporter pattern 140 connecting sidewalls of the adjacent lower electrodes 200 that face each other. The lower mold film 111 may be, e.g., completely, removed using regions where the lower supporter pattern 140 is not formed.

As a result, gaps S, e.g., empty spaces, may be formed between the upper supporter pattern 150 and the lower supporter pattern 140, and between the lower supporter pattern 140 and the etching stopper film 130.

Figure 19:
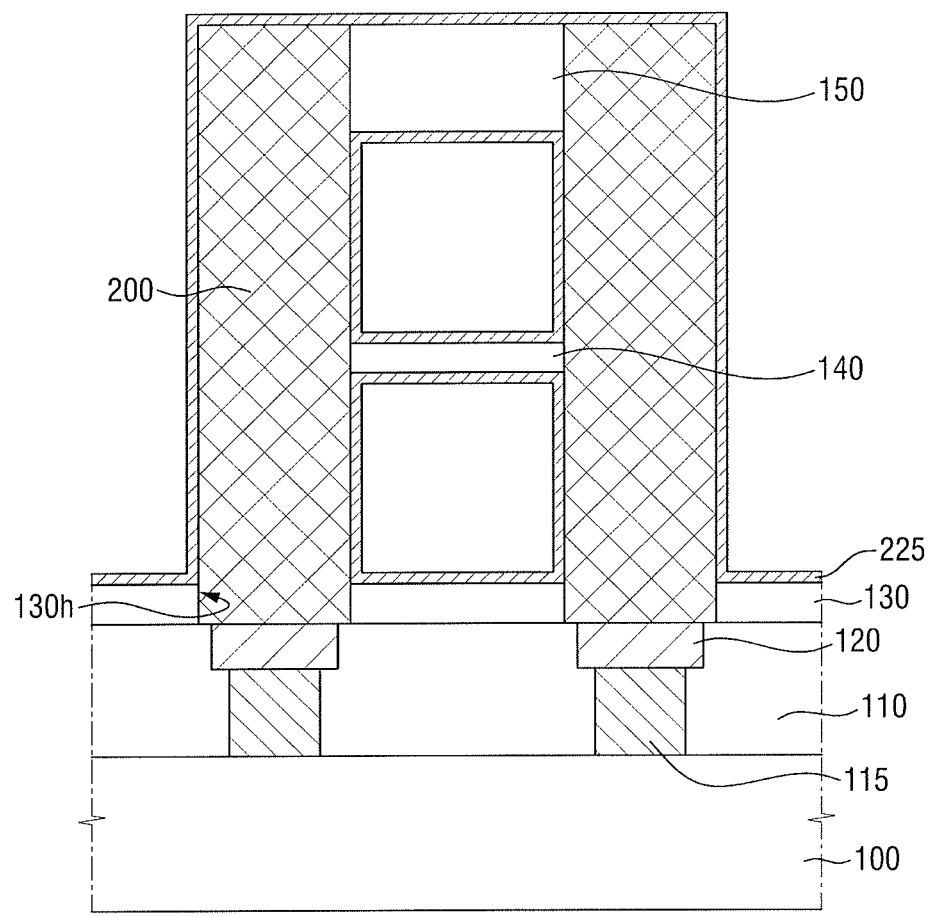

Referring to FIG. 19, an interface layer 225 may be formed along the profiles of the lower electrode 200, the upper supporter pattern 150, and the lower supporter pattern 140, and along the top surface of the etching stopper film 130. The interface layer 225 may include a metal dopant. The interface layer 225 may include at least one of, e.g., tin, molybdenum, niobium, tantalum, indium, nickel, cobalt, tungsten, titanium, vanadium, phosphorus, arsenic, antimony, bismuth, and ruthenium.

Figure 20:
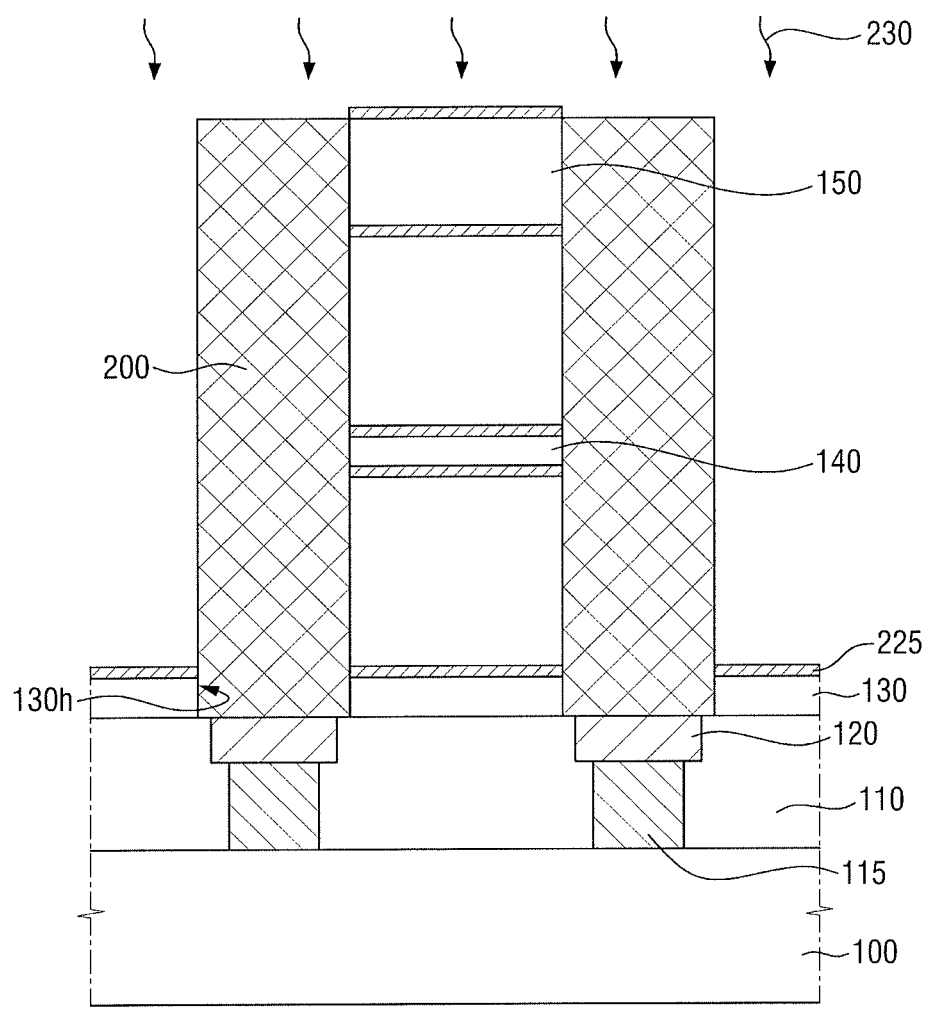

Referring to FIG. 20, the metal dopant included in the interface layer 225 may be diffused into the lower electrode 200 through a thermal treatment process 230. As a result, the lower electrode 200 may be doped with the metal dopant. For example, the concentration of the metal dopant may vary within the lower electrode 200 in accordance with the graph in FIG. 4, in accordance with portions of the lower electrode 200 in direct contact with the interface layer 225 which contains the metal dopant. For example, the concentration of the metal dopant may vary within the lower electrode 200 in accordance with the graph in FIG. 6, in accordance with a diffusion distance of the metal dopants within the lower electrode 200, e.g., the concentration of the metal dopants within the lower electrode 200 decreases as a distance from the outer sidewall 200ss increases.

Figure 21:
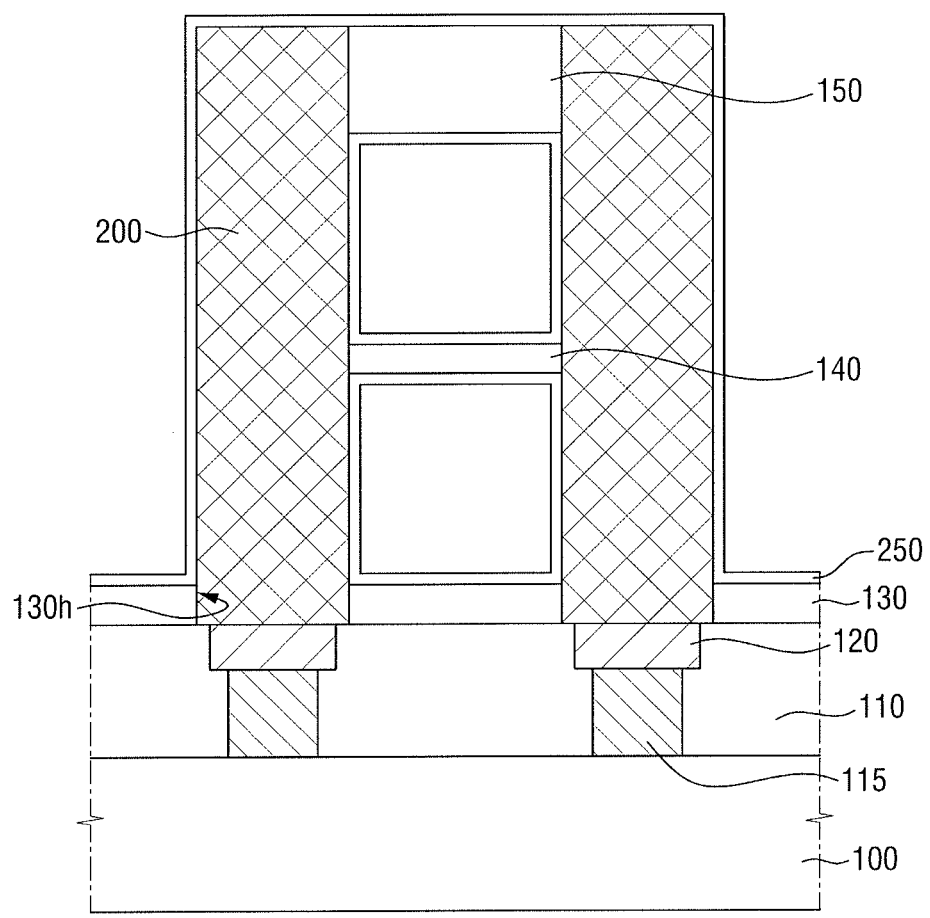

Referring to FIGS. 20 and 21, after the thermal treatment process 230, the interface layer 225 may be removed. Thereafter, the capacitor dielectric film 250 may be formed along the profiles of the lower electrode 200, the upper supporter pattern 150, and the lower supporter pattern 140, and along the top surface of the etching stopper film 130.

Referring again to FIG. 1, the upper electrode 260 may be formed on the capacitor dielectric film 250. For example, s illustrated in FIG. 1, a single upper electrode 260 may continuously cover two lower electrodes 200 that are adjacent to each other.

By way of summation and review, an increase in capacitance may increase an amount of charge that can be stored in a capacitor, thereby improving the refresh characteristic of the semiconductor device. Improved refresh characteristics of semiconductor devices may increase yields. In order to raise capacitance, a dielectric film having a high dielectric constant is used in capacitors, or the contact area of the lower electrodes of the capacitors and the dielectric film is enlarged.

Embodiments of the present disclosure provide a semiconductor device having engineered interfaces between lower electrodes and a capacitor dielectric film, thereby improving performance and reliability of the capacitor. Embodiments of the present disclosure also provide a method of fabricating a semiconductor device including the above noted capacitor.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a landing pad on a substrate;
a lower electrode on the landing pad and connected to the landing pad, the lower electrode including:
an outer portion, the outer portion including first and second regions, and
an inner portion inside the outer portion;
a dielectric film on the lower electrode to extend along the first region of the outer portion; and
an upper electrode on the dielectric film,
wherein the outer portion of the lower electrode includes a metal dopant, a concentration of the metal dopant in the first region of the outer portion being different from a concentration of the metal dopant in the second region of the outer portion.

2. The semiconductor device as claimed in claim 1, wherein the concentration of the metal dopant in the first region of the outer portion is higher than the concentration of the metal dopant in the second region of the outer portion.

3. The semiconductor device as claimed in claim 2, wherein an entirety of the second region of the outer portion is doped with the metal dopant.

4. The semiconductor device as claimed in claim 2, wherein the second region of the outer portion includes a first sub-region and a second sub-region, the first sub-region including the metal dopant, and the second sub-region not including the metal dopant.

5. The semiconductor device as claimed in claim 1, further comprising an etching stopper film on the landing pad, the etching stopper film exposing at least part of the landing pad, and the second region of the outer portion being in contact with the etching stopper film.

6. The semiconductor device as claimed in claim 1, further comprising a supporter pattern on the substrate and in contact with the lower electrode, the second region of the outer portion being in contact with the supporter pattern.

7. The semiconductor device as claimed in claim 1, wherein:
the outer portion includes a side portion having a sidewall of the lower electrode and a top portion having a top surface of the lower electrode, and
the side portion of the outer portion includes the first and second regions of the outer portion.

8. The semiconductor device as claimed in claim 1, wherein the metal dopant includes at least one of tin (Sn), molybdenum (Mo), niobium (Nb), tantalum (Ta), indium (In), nickel (Ni), cobalt (Co), tungsten (W), vanadium (V), phosphorus (P), arsenic (As), antimony (Sb), bismuth (Bi), and ruthenium (Ru).

9. The semiconductor device as claimed in claim 1, wherein the lower electrode is in a shape of a pillar or a cylinder extending in a thickness direction of the substrate.

10. The semiconductor device as claimed in claim 1, wherein the lower electrode includes a bottom portion which extends along a top surface of the landing pad and a sidewall portion which protrudes from the bottom portion.

11. A semiconductor device, comprising:
a landing pad on a substrate;
a lower electrode on the landing pad and connected to the landing pad, the lower electrode extending in a thickness direction of the substrate;
at least one supporter pattern in contact with part of the lower electrode;
a dielectric film extending along outer surfaces of the lower electrode and outer surfaces of the at least one supporter pattern; and
an upper electrode on the dielectric film,
wherein the outer surfaces of the lower electrode are at least partially doped with a metal dopant, a concentration of the metal dopant between the lower electrode and the dielectric film being higher than a concentration of the metal dopant between the lower electrode and the at least one supporter pattern.

12. The semiconductor device as claimed in claim 11, wherein the outer surfaces of the lower electrode between the lower electrode and the at least one supporter pattern include portions that do not have the metal dopant.

13. The semiconductor device as claimed in claim 11, wherein the at least one supporter pattern does not include the metal dopant.

14. The semiconductor device as claimed in claim 11, wherein:
the at least one supporter pattern includes the metal dopant, and
the outer surfaces of the at least one supporter pattern are doped with the metal dopant.

15. The semiconductor device as claimed in claim 14, wherein a concentration of the metal dopant at the outer surfaces of the at least one supporter pattern is lower than a concentration of the metal dopant at the outer surfaces of the lower electrode.

16. The semiconductor device as claimed in claim 11, further comprising an etching stopper film on the landing pad to expose at least part of the landing pad,
wherein:
the dielectric film extends along a top surface of the etching stopper film,
the etching stopper film includes the metal dopant, and
the top surface of the etching stopper film is doped with the metal dopant.

17. A semiconductor device, comprising:
a landing pad on a substrate;
an etching stopper film on the landing pad to expose part of the landing pad;
a first supporter pattern on the etching stopper film to be spaced apart from the etching stopper film, the first supporter pattern having a first thickness;
a second supporter pattern on the first supporter pattern to be spaced apart from the first supporter pattern, the second supporter pattern having a second thickness greater than the first thickness;
a lower electrode on the landing pad to be in contact with the etching stopper film, the first supporter pattern, and the second supporter pattern;
a dielectric film extending along profiles of the lower electrode, the first supporter pattern, and the second supporter pattern; and
an upper electrode on the dielectric film,
wherein a sidewall of the lower electrode is at least partially doped with a metal dopant, a part of the sidewall of the lower electrode between the lower electrode and the second supporter pattern including a portion that does not include the metal dopant.

18. The semiconductor device as claimed in claim 17, wherein a part of the sidewall of the lower electrode between the lower electrode and the first supporter pattern includes a portion that does not include the metal dopant.

19. The semiconductor device as claimed in claim 17, wherein the etching stopper film, the first supporter pattern, and the second supporter pattern do not include the metal dopant.

20. The semiconductor device as claimed in claim 17, wherein:
the lower electrode includes titanium nitride (TiN), and
the metal dopant includes at least one of tin (Sn), molybdenum (Mo), niobium (Nb), tantalum (Ta), indium (In), nickel (Ni), cobalt (Co), tungsten (W), vanadium (V), phosphorus (P), arsenic (As), antimony (Sb), bismuth (Bi), and ruthenium (Ru).

* * * * *